(12) United States Patent
Asahi et al.

(10) Patent No.: US 8,575,529 B2
(45) Date of Patent: Nov. 5, 2013

(54) PHOTOELECTRIC CONVERTER PROVIDING A WAVEGUIDE ALONG THE SURFACE OF THE MOUNT SUBSTRATE

(75) Inventors: Nobuyuki Asahi, Hirakata (JP); Makoto Nishimura, Toyonaka (JP); Hiroyuki Yagyu, Hirakata (JP); Yutaka Kinugasa, Katano (JP); Takuya Matsumoto, Osaka (JP)

(73) Assignee: Panasonic Corporation, Osaka (JP)

( * ) Notice: Subject to any disclaimer, the term of this patent is extended or adjusted under 35 U.S.C. 154(b) by 813 days.

(21) Appl. No.: 12/376,891

(22) PCT Filed: Aug. 8, 2007

(86) PCT No.: PCT/JP2007/065887
§ 371 (c)(1),
(2), (4) Date: Feb. 9, 2009

(87) PCT Pub. No.: WO2008/018620
PCT Pub. Date: Feb. 14, 2008

(65) Prior Publication Data
US 2010/0171023 A1 Jul. 8, 2010

(30) Foreign Application Priority Data

Aug. 10, 2006 (JP) ................................. 2006-218776
Sep. 29, 2006 (JP) ................................. 2006-268999

(51) Int. Cl.
*G01J 1/42* (2006.01)
(52) U.S. Cl.
USPC .............................. 250/205; 385/50; 341/143
(58) Field of Classification Search
USPC ............. 250/205, 227.11; 385/14, 31, 49, 50, 385/89; 341/143, 155
See application file for complete search history.

(56) References Cited

U.S. PATENT DOCUMENTS

| 4,904,036 | A | 2/1990 | Blonder |
| 5,345,524 | A | 9/1994 | Lebby et al. |
| 6,236,786 | B1 | 5/2001 | Aoki et al. |
| 6,257,771 | B1 | 7/2001 | Okayasu |

(Continued)

FOREIGN PATENT DOCUMENTS

| CN | 1338880 | 3/2002 |
| CN | 1449010 | 10/2003 |

(Continued)

OTHER PUBLICATIONS

English language Abstract of EP 0893711, Jan. 27, 1999.

(Continued)

*Primary Examiner* — Seung C Sohn
(74) *Attorney, Agent, or Firm* — Greenblum & Bernstein, P.L.C.

(57) ABSTRACT

To provide a photoelectric converter capable of reducing the height of the device. The photoelectric converter includes: a light emitting element or a light receiving element; an IC circuit for transmitting/receiving an electric signal to/from the light emitting element or the light receiving element; a mount substrate adapted to be mounted on one surface from the side on which the light emitting element emits light, or the side on which the light receiving element receives light; an electric connector adapted to be provided on the one surface or the other surface of the mount substrate, and to be attached and detached to and from an external connector; and a waveguide adapted to be provided on the mount substrate along the one surface or the other surface of the mount substrate, and to be optically coupled to the light emitting element or the light receiving element.

16 Claims, 34 Drawing Sheets

(56) References Cited

U.S. PATENT DOCUMENTS

| | | |
|---|---|---|
| 6,490,392 B1 | 12/2002 | Munekata et al. |
| 6,507,384 B1 | 1/2003 | Endo et al. |
| 6,793,405 B1 | 9/2004 | Murata et al. |
| 6,854,901 B1 | 2/2005 | Ouchi |
| 6,870,590 B2 | 3/2005 | Shoji |
| 7,312,621 B2 | 12/2007 | Yamaguchi et al. |
| 7,668,414 B2 | 2/2010 | Shemi et al. |
| 2002/0028045 A1 | 3/2002 | Yoshimura et al. |
| 2002/0039464 A1 | 4/2002 | Yoshimura et al. |
| 2002/0044329 A1 | 4/2002 | Shoji |
| 2002/0097962 A1 | 7/2002 | Yoshimura et al. |
| 2004/0017977 A1 | 1/2004 | Lam et al. |
| 2004/0205402 A1 | 10/2004 | Yamaguchi et al. |
| 2005/0099402 A1 | 5/2005 | Nakanishi et al. |
| 2007/0247340 A1 | 10/2007 | Tada |
| 2007/0290914 A1 | 12/2007 | Matsushita et al. |
| 2008/0266159 A1 | 10/2008 | Murata et al. |
| 2009/0016670 A1 | 1/2009 | Shemi et al. |

FOREIGN PATENT DOCUMENTS

| | | |
|---|---|---|
| CN | 1501765 | 6/2004 |
| CN | 1588233 | 3/2005 |
| CN | 1614624 | 5/2005 |
| EP | 0893711 | 1/1999 |
| GB | 2322479 | 8/1998 |
| JP | 2-9187 | 1/1990 |
| JP | 6-337334 | 12/1994 |
| JP | 2001-42170 | 2/2001 |
| JP | 2004-165305 | 6/2004 |
| JP | 2005-77640 | 3/2005 |
| JP | 2006-3818 | 1/2006 |
| TW | 396282 | 7/2000 |
| WO | 00/08505 | 2/2000 |
| WO | 2006/067778 | 6/2006 |

OTHER PUBLICATIONS

English language Abstract of JP 2001-42170, Feb. 16, 2001.
Japanese Office Action issued on Jun. 14, 2011 by the Japan Patent Office in corresponding Japanese Patent Application No. 2006-268999 (together with English language Abstract of the Office Action).
Taiwan Office Action, dated Jun. 30, 2011, in the corresponding Taiwanese Patent Application No. 96129354.
Extended European Search Report, dated on Aug. 23, 2011, for corresponding European Patent Application No. 11004806.3.
China Office Action, mailed May 3, 2012, for corresponding Chinese Patent Application No. 200780037649.9.
China Office Action, mailed Apr. 3, 2013, in corresponding Chinese Patent Application No. 200780037649.9.
Japanese Office Action, issued on Aug. 23, 2011, for the corresponding Japanese Patent Application No. 2006268999.

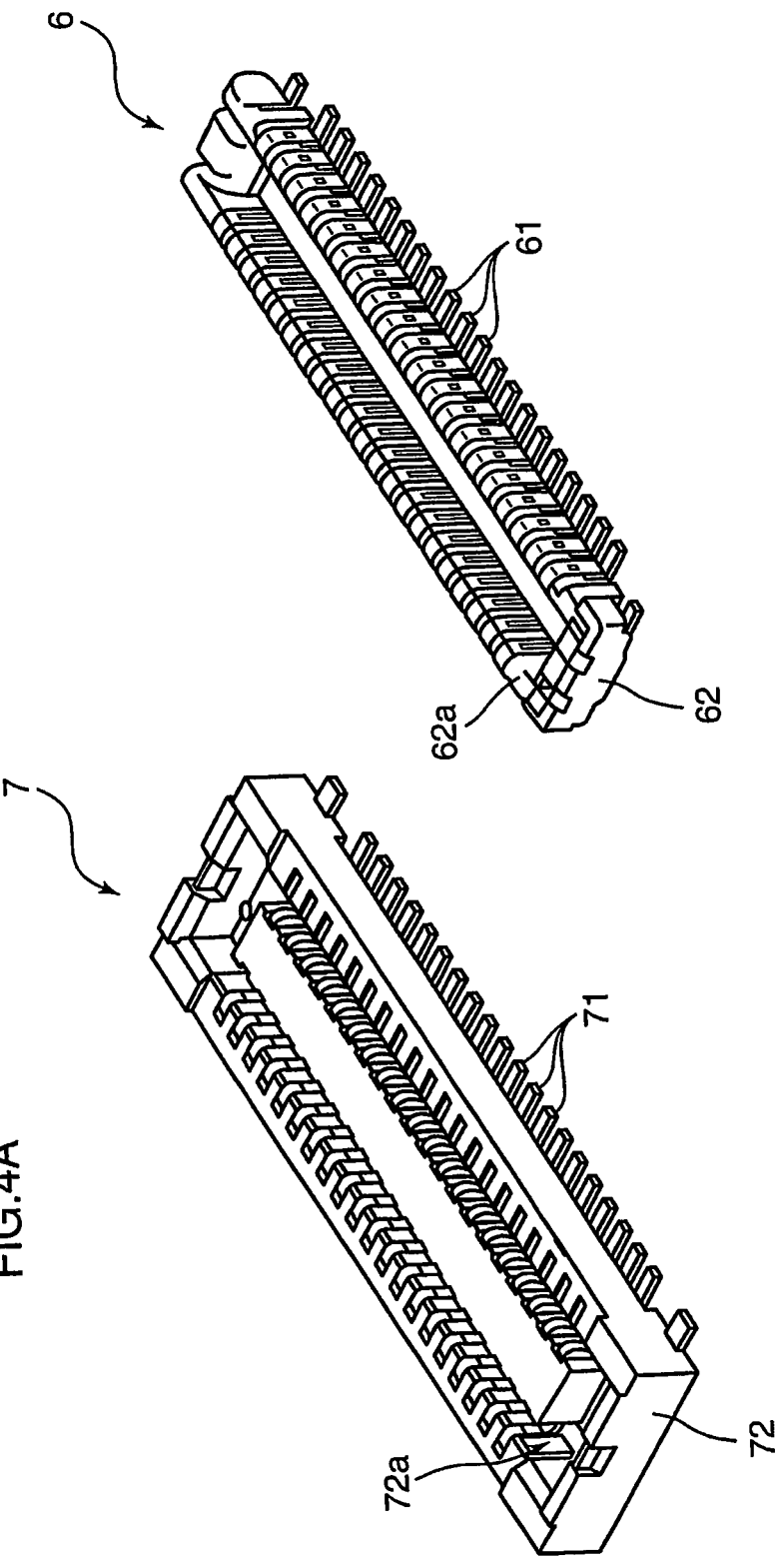

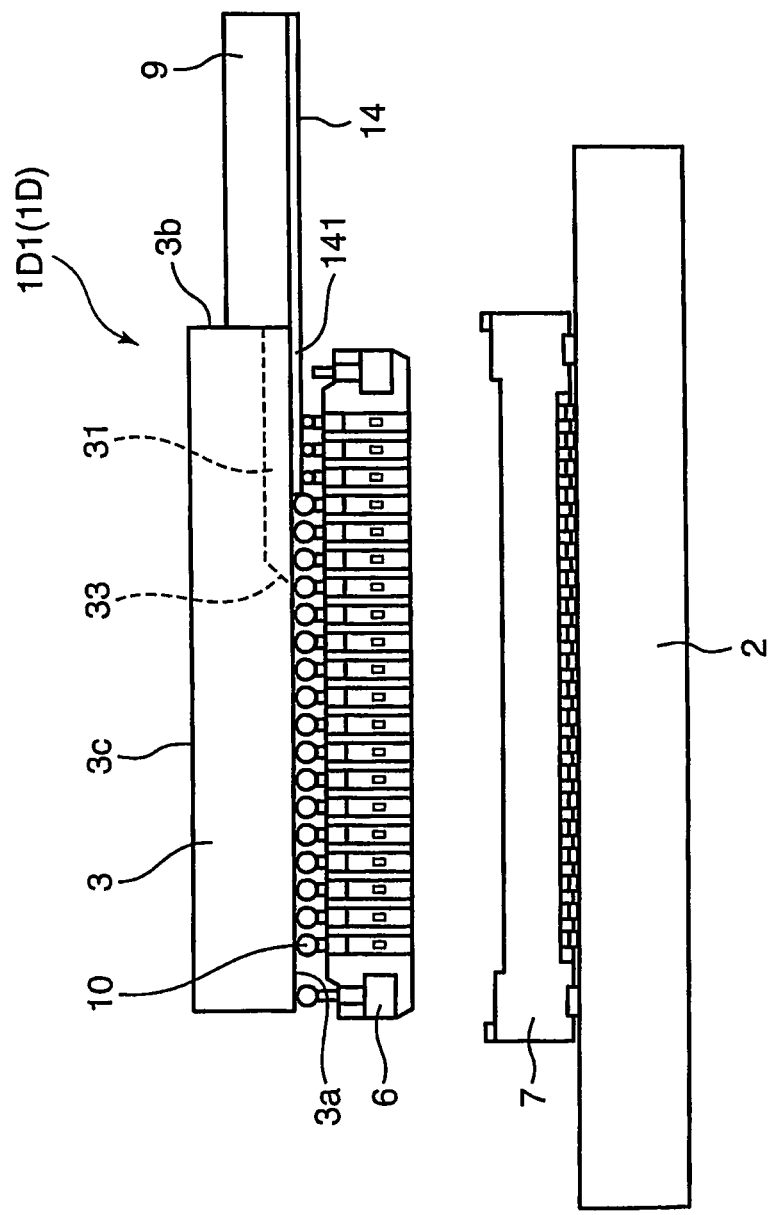

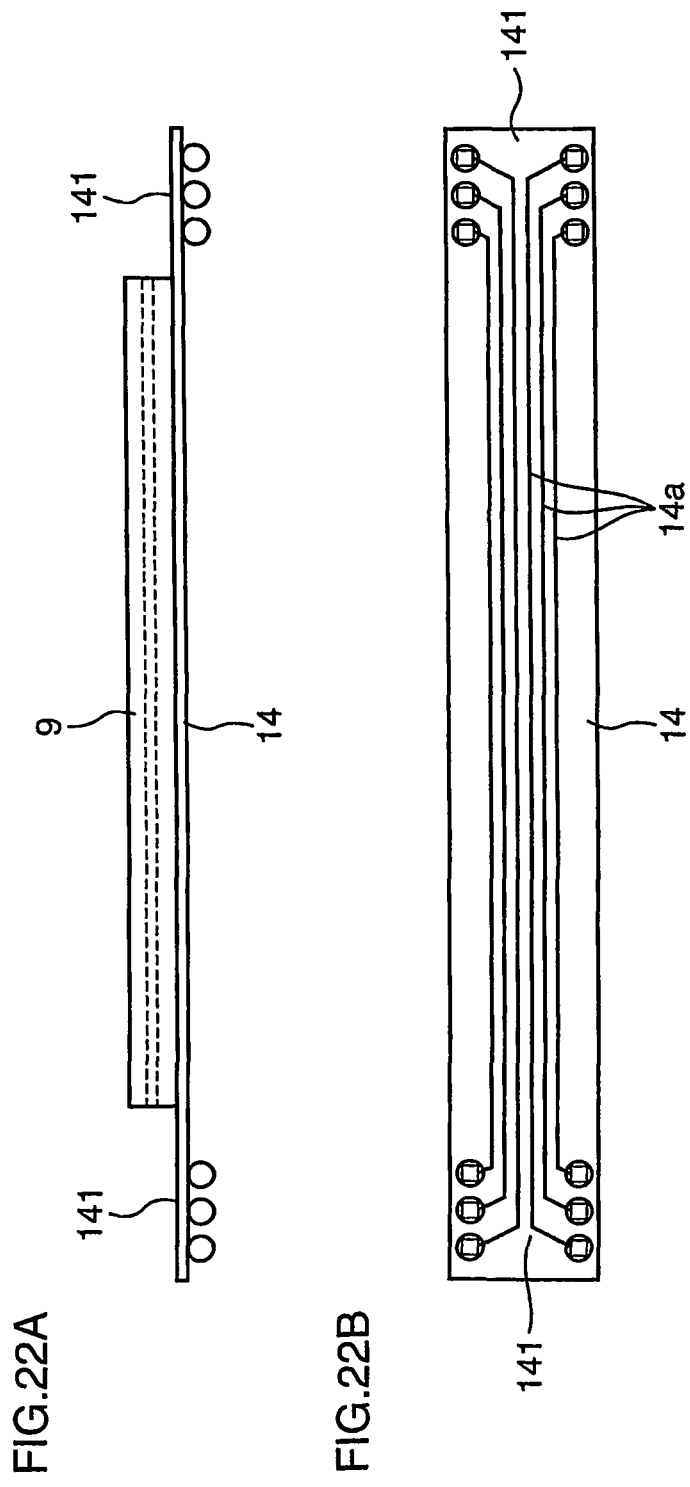

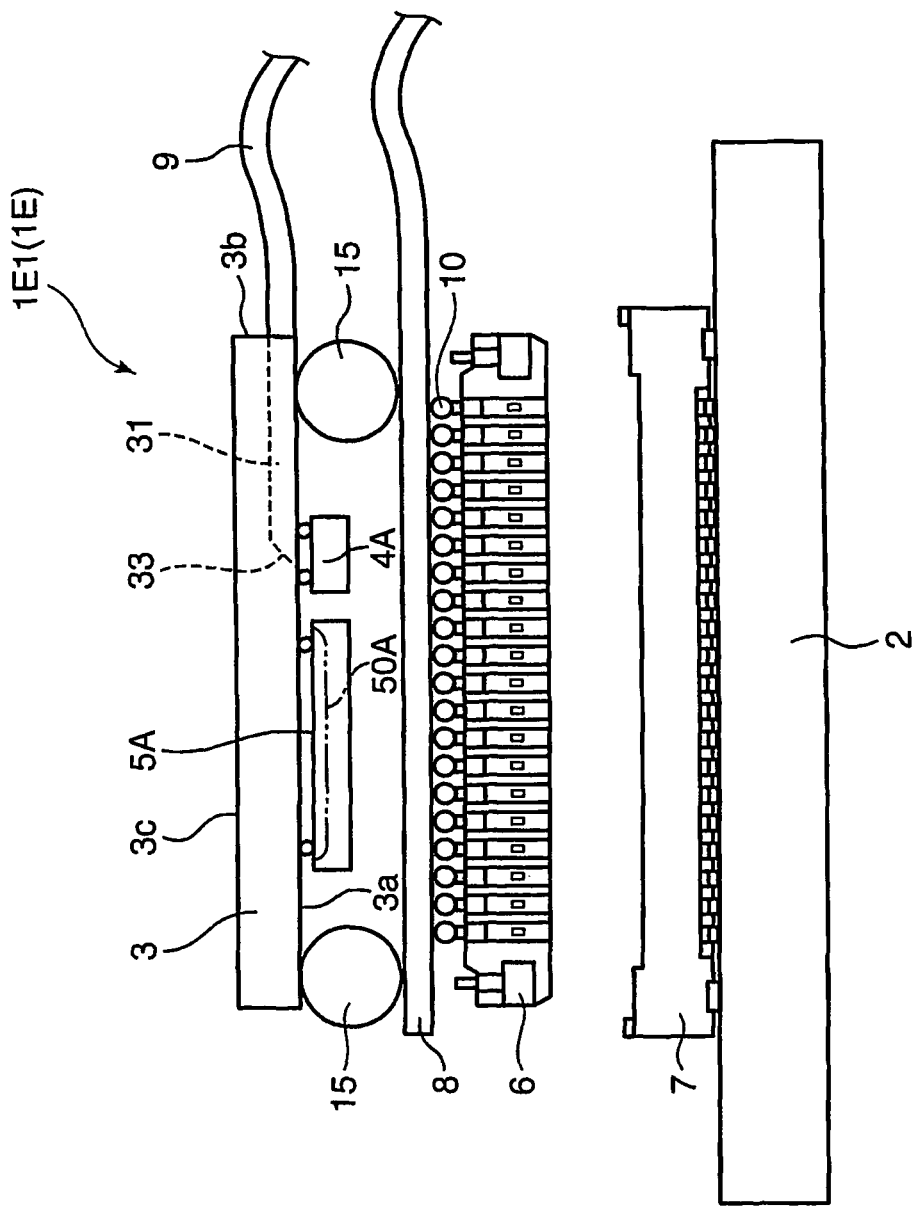

PHOTOELECTRIC CONVERTER PROVIDING A WAVEGUIDE ALONG THE SURFACE OF THE MOUNT SUBSTRATE

TECHNICAL FIELD

The present invention relates to a photoelectric converter provided with an optical element.

BACKGROUND ART

Conventionally, as a photoelectric converter, as described in, for example, FIG. 9 of Patent Document 1, there is known a type including: a light emitting element which emits light by converting an electric signal into an optical signal; a substrate on which an IC circuit for transmitting an electric signal to the light emitting element is formed and the light emitting element is mounted on one surface from the side opposite to the light emitting side of the light emitting element: and a waveguide which is arranged to extend from the light emitting element in the direction perpendicular to the one surface of the substrate and transmits the light emitted by the light emitting element. Note that in place of the light emitting element, it is also possible to use a light receiving element which receives light and converts the received optical signal to an electric signal.

In the photoelectric converter described in FIG. 9 of Patent document 1, a male electric connector which is attachable and detachable to and from a female electric connector provided on a wiring substrate, is provided on the other surface of the substrate, and the substrate and the wiring substrate are electrically connected to each other by connecting these electric connectors.

In the above described constitution, however, a waveguide is provided so as to extend from the light emitting element in the direction perpendicular to the one surface of the substrate, which causes the height of the whole device to be significantly increased.

Here, as described in FIG. 3 of Patent Document 1, it is conceivable that the light emitting direction of the light emitting element is adapted to be arranged in parallel with the wiring substrate by providing the electric connector on the side surface of the substrate. However, even in this manner, the device height at least corresponding to the size of the light emitting element and a control IC element is necessary, and hence it is not possible to significantly suppress the device height.

Patent Document 1: Japanese Patent Laid-Open No. 2001-42170

DISCLOSURE OF THE INVENTION

In view of the above described circumstances, it is an object of the present invention is to provide a photoelectric converter which makes it possible to reduce the device height.

In order to solve the above described problem, according to the present invention, there is provided a photoelectric converter characterized by including: a mount substrate; an IC circuit adapted to be provided on the mount substrate; an optical element adapted to have a function of converting an electric signal output from the IC circuit to an optical signal and emitting light, or a function of converting a received optical signal to an electric signal and outputting the electric signal to the IC circuit; and a waveguide adapted to effect an optical coupling between the optical element and an external optical device, and in that the optical element is held on the mount substrate and has a light emitting surface or a light receiving surface, the light emitting surface or the light receiving surface being directed to the mount substrate, and the waveguide is provided on the mount substrate along the surface of the mount substrate.

According to the present invention, since the waveguide is provided along the surface of the mount substrate, it is possible to suppress the height of the whole device in the thickness direction of the mount substrate, and to thereby achieve the low height of the device.

BRIEF DESCRIPTION OF THE DRAWINGS

FIG. 4A is a perspective view of a socket type electric connector;

FIG. 4B is a perspective view of a header type electric connector;

FIG. 21 is a figure schematically showing a constitution of a photoelectric converter, according to a fourth embodiment of the present invention;

FIG. 22A is a side view of an external waveguide to which a circuit film is joined;

FIG. 22b is a bottom view of the circuit film;

FIG. 23 is a figure schematically showing a constitution of a photoelectric converter, according to a fifth embodiment of the present invention;

BEST MODE FOR CARRYING OUT THE INVENTION

In the following, the best mode for carrying out the present invention is described with reference to accompanying drawings.

Figure 1:
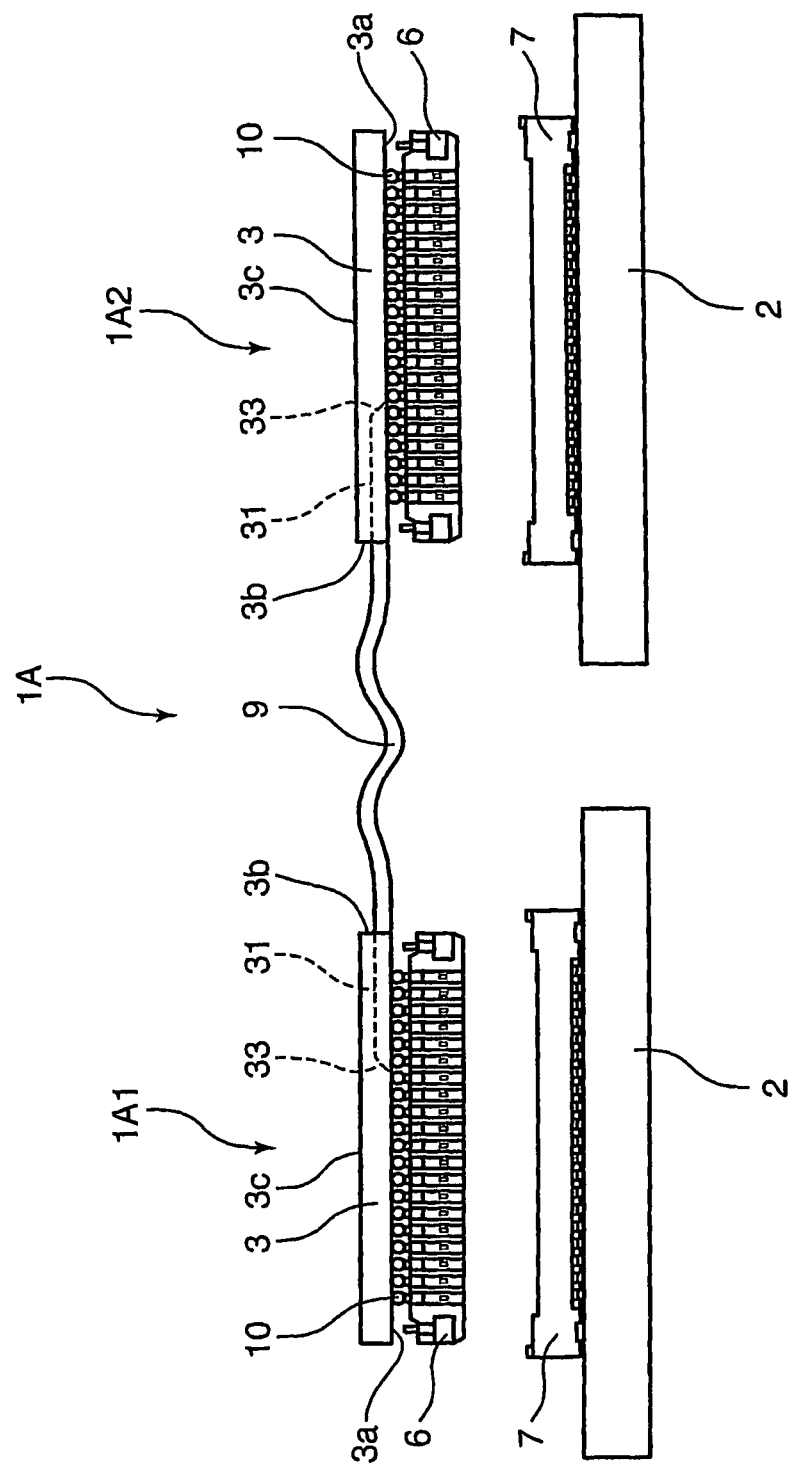
FIG. 1 is a figure schematically showing a constitution of a photoelectric converter and a wiring substrate connected to the photoelectric converter, according to a first embodiment of the present invention.

FIG. 1 shows a photoelectric converter 1A according to a first embodiment of the present invention. The photoelectric converter 1A includes a light emitting side photoelectric converting portion (also referred to as E/O module) 1A1 adapted to be mounted on a wiring substrate 2 by engagement of a header (electric connector) 6 and a socket (electric connector) 7, a light receiving side photoelectric converting portion (also referred to as O/E module) 1A2 adapted to be mounted by engagement of the electric connectors 6 and 7 similarly to the other wiring substrate 2, and an external waveguide 9 adapted to effect an optical coupling between the converting portions 1A1 and 1A2. That is, in the photoelectric converter 1A, the electric converting portion on the other side seen from the light emitting side photoelectric converting portion 1A1 or the light receiving side photoelectric converting portion 1A2 is positioned as an "external optical device".

Note that in this specification, the vertical direction in FIG. 1 means the vertical direction, and the direction perpendicular to the paper surface in FIG. 1 means the right and left direction, while the right side and the left side in FIG. 1 means the front and the rear for the light emitting side photoelectric converting portion 1A1, respectively, and the left side and the right side in FIG. 1 means the front and the rear for the light receiving side photoelectric converting portion 1A2.

Figure 2:
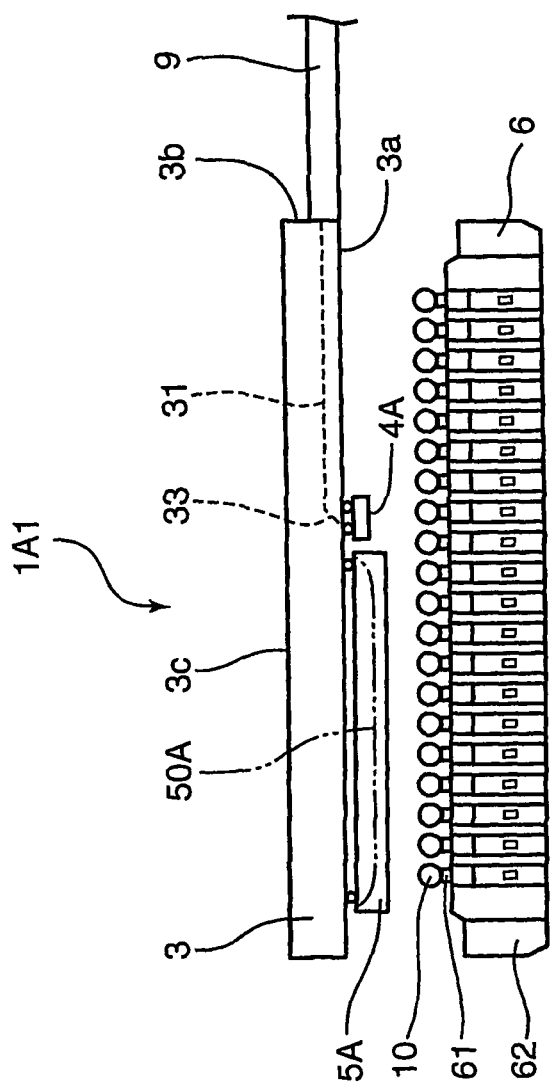
FIG. 2 is an exploded view of a light emitting side photoelectric converting portion of the photoelectric converter of the first embodiment.

The light emitting side photoelectric converting portion 1A1 is provided with a mount substrate 3 formed into a rectangular form extending in the front and rear direction in plan view. As shown in FIG. 2, a light emitting element 4A which converts an electric signal to an optical signal and emits light, and an IC substrate 5A in which an IC circuit 50A for transmitting the electric signal to the light emitting element 4A is formed, are mounted on one surface 3a set as the lower surface of the mount substrate 3. The header type electric connector (hereinafter referred to simply as a "header") 6 is provided so as to cover these components 4A and 5A from below. Further, on the one surface 3a of the mount substrate 3, power source lines for driving and signal lines of the light emitting element 4A are formed in a wiring pattern 36 as shown in FIG. 6C. Further, on the mount substrate 3, a mirror portion 33 which converts an optical path of a light beam emitted by the light emitting element 4A by approximately 90 degrees is provided at a position just above the light emitting element 4A, and an internal waveguide 31 optically coupled with the light emitting element 4A is provided so as to extend from the mirror portion 33 to the front end surface 3b of the mount substrate 3.

The light emitting element 4A emits light upward from the upper surface, and is mounted on the one surface 3a of the mount substrate 3 from the light emitting side. As the light emitting element 4A, a VCSEL (Vertical Cavity Surface Emitting Laser) which is a semiconductor laser is adopted. The IC substrate 5A is a driver IC for driving the VCSEL, and arranged near the light emitting element 4A. The light emitting element 4A and the IC substrate 5A are connected to the wiring pattern 36 of the mount substrate 3 by bumps 11 (see FIG. 3) made of gold or solder. Note that an LED or the like can also be adopted as the light emitting element 4A. However, the LED or the like has no directivity and a small optical coupling rate with the internal waveguide 31, and hence can be adopted under the condition that there is a margin in the efficiency of light. In such case, the LED or the like is advantageous in terms of low cost.

In order to avoid the influence of the heat at the time of mounting and the influence of the stress in the operating environment, the rigidity is required for the mount substrate 3. Further, in the case of optical transmission, since the optical transmission efficiency from the light emitting element to the light receiving element is required, it is necessary to highly precisely mount the optical element, and to suppress positional variation due to the thermal effect in use as much as possible. For this reason, a silicon substrate is adopted as the mount substrate 3. Further, the mount substrate 3 is preferably formed of a material having a coefficient of linear thermal expansion close to that of the light emitting element 4A, and may be formed of a compound semiconductor such as GaAs which is the same material system as the VCSEL material, except silicon. Alternatively, the mount substrate 3 may also be formed of a ceramics material, such as aluminum nitride and silicon nitride, as a material having an excellent coefficient of linear expansion and thermal conductivity.

The mirror portion 33 can be formed by making gold and aluminum vapor-deposited on the 45-degree inclined surface which is formed by etching the mount substrate 3. Note that the 45-degree inclined surface can be formed by, for example, an anisotropic etching using a potassium hydroxide solution.

Figure 3A:
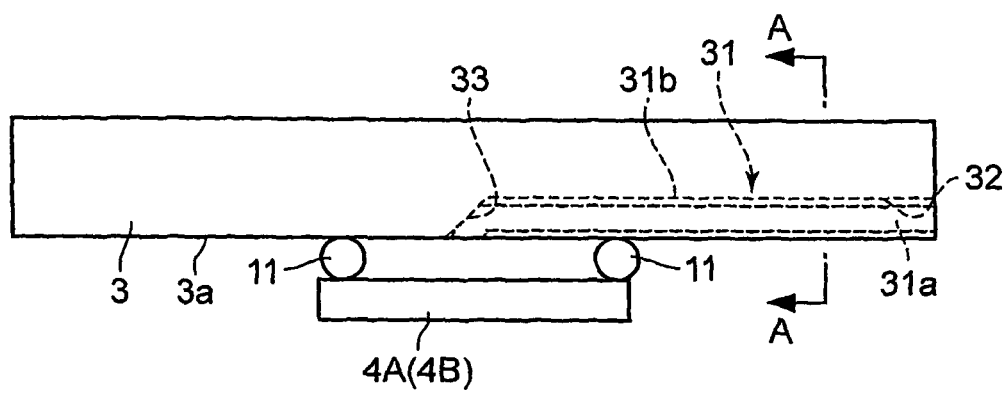
FIG. 3A is a side view of a mount substrate on which an optical element is mounted.
Figure 3B:
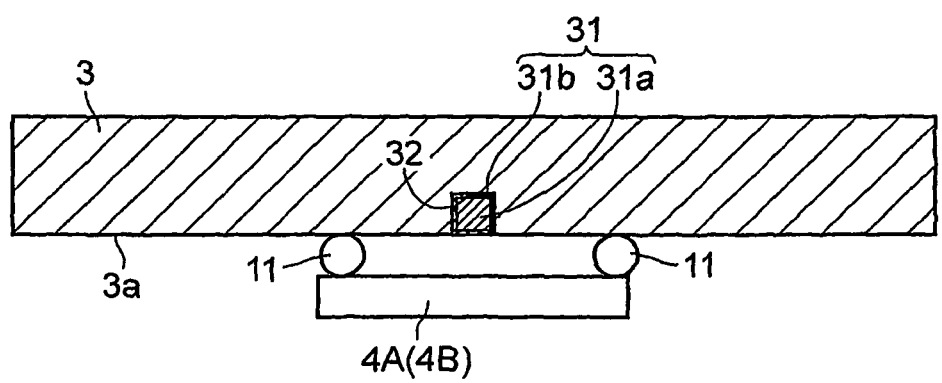
FIG. 3B is a sectional view along the line A-A in FIG. 3A.

The internal waveguide 31 is provided along the one surface 3a of the mount substrate 3, and adapted to transmit the light emitted by the light emitting element 4A in the direction parallel to the one surface 3a of the mount substrate 3. The internal waveguide 31 is constituted by two kinds of resin having different refractive indices. Specifically, the internal waveguide 31 is constituted by a core 31a for guiding light and a clad 31b which covers and holds the core 31a from the circumference thereof, as shown in FIG. 3, and is provided in a groove 32 for waveguide formation which is formed in the mount substrate 3. The core 31a is made of resin having a high refractive index, and clad 31b is made of resin having a low refractive index. The size of the core 31a and the clad 31b is determined by the calculation of the optical loss due to the divergent angle of the light emitting element 4A, the light receiving diameter of the light receiving element 4B, as will be described below, and the like. Note that the internal waveguide 31 may be constituted by an inorganic material such as quartz other than resin, provided that the material is a light transmissive material.

The external waveguide 9 is adapted to be joined to the front end surface 3b of the mount substrate 3 by an optical adhesive, so that the internal waveguide 31 is optically coupled with the external waveguide 9 by the joining processing. That is, the waveguide according to the present invention is constituted by the mirror portion 33, the internal waveguide 31, and the external waveguide 9. Note that when the distance from the mirror portion 33 to the external waveguide 9 is short, there is a case where the amount of the loss caused by simply making the light propagated in the air is small. In this case, the light may be made directly incident on the external waveguide 9 from the mirror portion 33 by eliminating the internal waveguide 31.

As the external waveguide 9, it is more convenient in terms of handling to use a flexible film-like wave guide obtained by thinning the resin optical waveguide. That is, the film-like external waveguide 9 is superior in bending characteristics, and hence there is no problem even when it is used in, for example, a bending portion of a cellular phone (cell phone, mobile phone) or the like. Although light loss may be caused depending on the bending curvature, it is possible to reduce the light loss by increasing the difference in refractive index between the core and the clad. Note that as the external waveguide 9, a quartz based fiber or a plastic fiber may also be used other than the film-like waveguide.

Specifically, the front end surface 3b of the mount substrate 3 and the external waveguide 9 are joined to each other in such a manner that a gap between the mount substrate 3 and the external waveguide 9 is set to 5 to 30 μm, and an adhesive is filled in the gap so as to be cured by ultraviolet rays. Alternatively, it is possible to fill the adhesive without any shortage of the adhesive, by filling the adhesive in the gap between the mount substrate 3 and the external waveguide 9 at the time when the gap is set to about 100 μm, and then reducing the gap.

Note that when the groove 32 for waveguide formation is formed in the mount substrate 3, it is possible to simplify the positioning between the mount substrate 3 and the external waveguide 9 and to realize passive alignment, by forming a groove in the other portion, and also providing in the external waveguide 9 a portion shaped so as to be engaged with the groove.

The header 6 is a type which can be attached and detached to and from the socket type electric connector (hereinafter referred to simply as "socket") 7 which is an external connector provided on the wiring substrate 2. Note that the header 6 and the socket 7 are replaceable with each other. It may be adapted such that the socket 7 is provided on the mount substrate 3, and the header 6 is provided on the wiring substrate 2 to make the header 6 serve as an external connector.

The socket 7 is formed into substantially a rectangular form extending in the front and rear direction in plan view, as shown in FIG. 4A. The socket 7 has a socket body 72 and a terminal 71 held by the socket body 72. A rectangular frame-like fitting recess 72a is provided in the socket body 72 in plan view, and the terminal 71 is exposed in the fitting recess 72a. Further, the end of the terminal 71 extends from the socket body 72 in the left and right directions, and is connected to a wiring pattern (not shown) formed on the upper surface of the wiring substrate 2, by solder (not shown) or the like. The socket 7 is usually mounted on the wiring substrate 2 by reflow soldering.

On the other hand, the header 6 is formed into substantially a rectangular form which is one size smaller than the socket 7 and extends in the front and rear direction in bottom view, as shown in FIG. 4B. The header 6 has a header body 62 and a terminal 61 held by the header body 62. A rectangular frame-like fitting protrusion 62a fittable to the fitting recess 72a of the socket 7 is formed in the header body 62 in bottom view, and the terminal 61 is exposed on the surface of the fitting protrusion 62a. Further, the end of the terminal 61 extends from the header body 62 in the left and right directions, and is connected to the wiring pattern 36 of the mount substrate 3 by solder balls 10. For mounting the header 6 to the mount substrate 3, it is possible to use a terminal post, a pin or the like besides the solder ball. Note that the height including the mount substrate 3 and the solder ball 10 is about 1 mm.

When the fitting protrusion 62a of the header 6 is inserted into the fitting recess 72a of the socket 7 so as to fit with the fitting recess 72a, the terminals 61 and 71 are brought into contact with each other so that the wiring pattern of the wiring substrate 2 is electrically connected to the wiring pattern 36 of the mount substrate 3. At this time, the height from the lower surface of the socket 7 to the upper surface of the header 6 is about 1 mm. As a result, when the light emitting side photoelectric converting portion 1A1 is mounted on the wiring substrate 2, the height from the upper surface of the wiring substrate 2 to the other surface 3c of the mount substrate 3 is about 2 mm.

Figure 5:
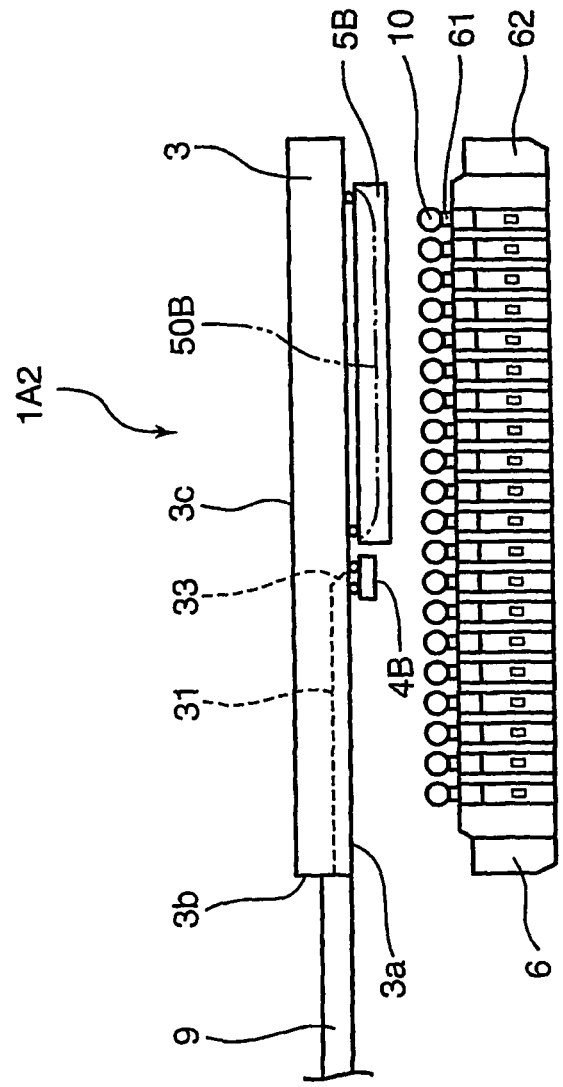
FIG. 5 is an exploded view of a light receiving side photoelectric converting portion of the photoelectric converter of the first embodiment.

Since the fundamental constitution of the light receiving side photoelectric converting portion 1A2 is the same as that of the light emitting side photoelectric converting portion 1A1, and detailed explanation thereof is omitted. Note that the light receiving side photoelectric converting portion 1A2 is different from the light emitting side photoelectric converting portion 1A1 in that a light receiving element 4B which receives light and converts the optical signal to an electric signal, and an IC substrate 5B in which an IC circuit 50B for receiving the electric signal from the light receiving element 4B is formed, are mounted on the one surface 3a of the mount substrate 3, as shown in FIG. 5. A PD (photodiode) is adopted as the light receiving element 4B, and the IC substrate 5B is a TIA (Trans-impedance Amplifier) element which performs current/voltage conversion. Further, an amplifier element may also be mounted on the mount substrate 3.

Next, with reference to FIG. 6 and FIG. 7, a manufacturing method of the photoelectric converter 1A is explained.

Note that in the photoelectric converter 1A, the light emitting side photoelectric converting portion 1A1 and the light receiving side photoelectric converting portion 1A2 can be separately manufactured and the manufacturing methods for these are the same. Thus, the manufacturing method of light emitting side photoelectric converting portion 1A1 is explained on behalf of the methods.

Figure 6A:
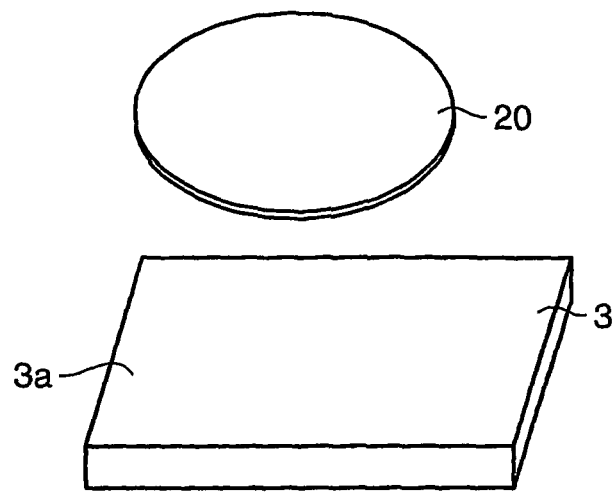
FIGS. 6A to 6C are illustrations explaining a manufacturing process of the photoelectric converter.

1) In the present manufacturing method, as shown in FIG. 6A, a plurality of mount substrates 3 are simultaneously formed by using a silicon wafer (silicon substrate) 20, and the silicon wafer 20 is cut and eventually divided into individual mount substrates 3. Note that in FIG. 6 and FIG. 7, the figure in the upper stage shows the silicon wafer 20 as a whole, and the figure in the lower stage shows a portion corresponding to a single mount substrate 3 on an enlarged scale. As the silicon wafer 20, those whose crystal orientation is selected are prepared for the etching performed in the following step.

Figure 6B:
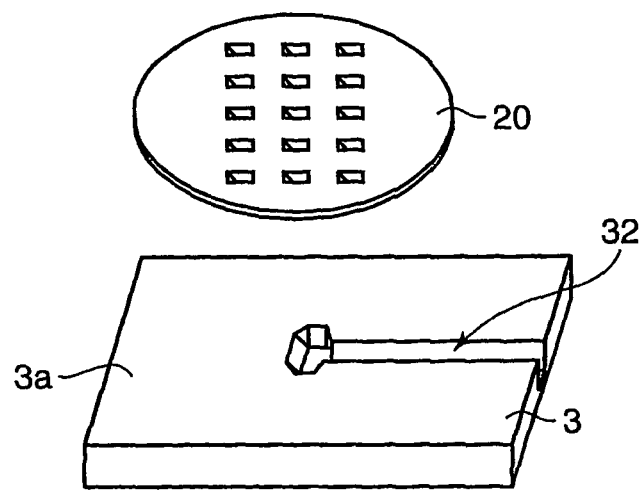
Figure 6C:
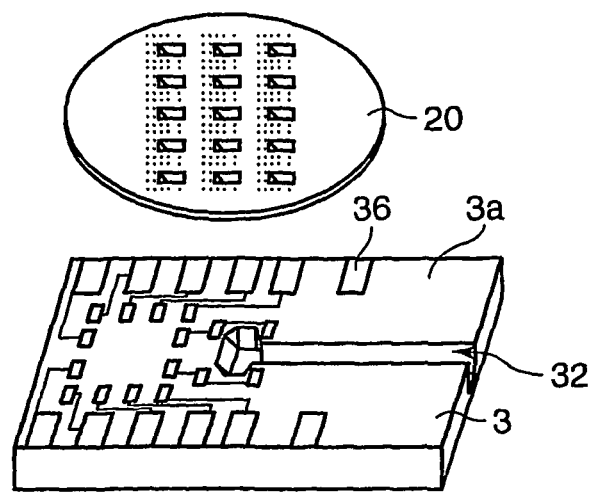

2) As shown in FIG. 6B, a 45-degree inclined surface for forming the groove 32 for waveguide formation and the mirror portion 33 is formed in the silicon wafer 20. These are formed by the anisotropic etching utilizing the difference in the etching rate of silicon crystal. In this case, the etching mask shape, etchant concentration and chemical composition are adjusted in order to form the 45-degree inclined surface. Besides the anisotropic etching, there is a forming method by dry etching, such as a reactive ion etching method, for forming the groove 32 for waveguide formation.

Figure 8B:
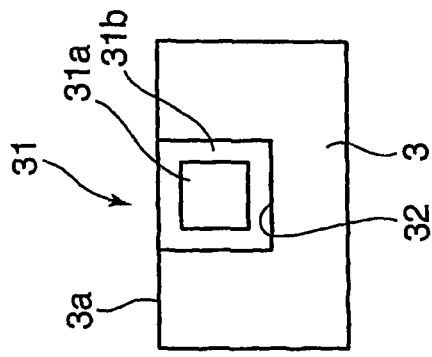
FIG. 8B is a sectional view of FIG. 8A.
Figure 8D:
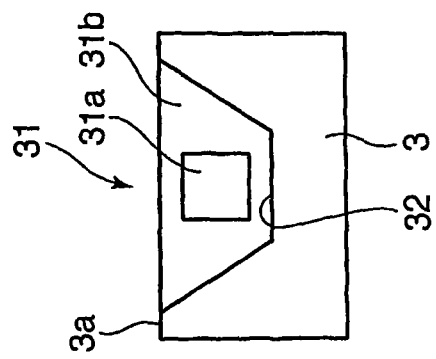
FIG. 8D is a sectional view of FIG. 8C.
Figure 8A:
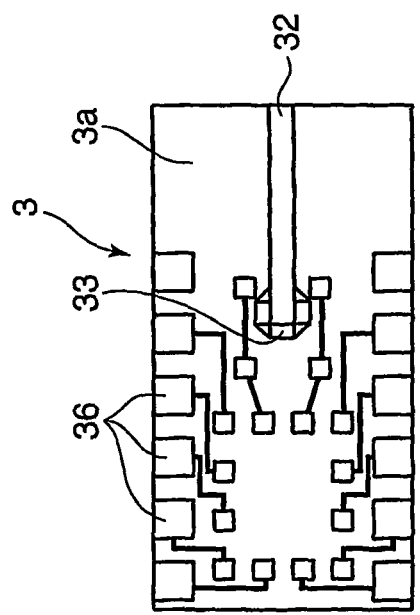
FIG. 8A is a plan view of the mount substrate after a waveguide is formed.

As shown in FIG. 8A and FIG. 8B, when the groove 32 for waveguide formation having a substantially rectangular shaped cross section and the 45-degree inclined surface are formed by the anisotropic etching, the etching conditions for these are different from each other. That is, the chemical composition of the etching solution is different for these. Therefore, it is necessary to perform etching in two steps. However, either one of the steps may be performed first.

Figure 8C:
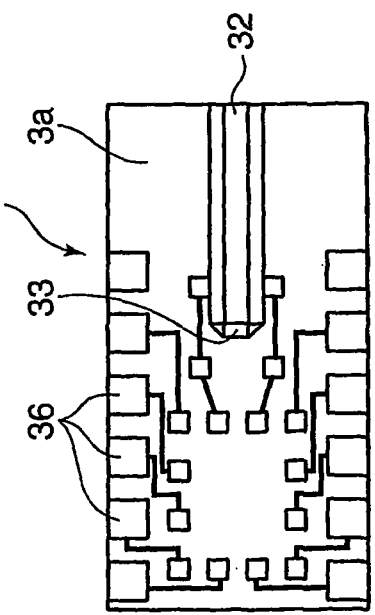
FIG. 8C is a plan view of the mount substrate after the waveguide is formed according to a modified manufacturing method.

Alternatively, when the groove 32 for waveguide formation and the 45-degree inclined surface are simultaneously formed, the cross sectional shape of the groove 32 for waveguide formation is formed into an approximately trapezoidal shape, so that the groove width of the groove 32 for waveguide formation is increased, as shown in FIG. 8C and FIG. 8D. The groove 32 for waveguide formation can be formed in this way, because there is no problem unless the groove 32 for waveguide formation is extended to the bonding pad for the light emitting elements 4A formed in the following step.

3) As shown in FIG. 6C, the wiring pattern 36 for mounting the light emitting element 4A is formed on the silicon wafer 20. The wiring is patterned by vapor-depositing gold on the silicon wafer 20. At this time, the gold is also simultaneously vapor-deposited on the 45-degree inclined surface, so as to form the mirror portion 33. Note that depending upon the wavelength to be used, it is possible to use the 45-degree inclined surface as the mirror portion 33 as it is without vapor-depositing gold on the 45-degree inclined surface, but for example, when a near-infrared light source is used, it is possible to increase the reflectance and the optical coupling efficiency by vapor-depositing gold on the 45-degree inclined surface. Note that as a wiring material other than gold, a multilayer structure of titanium, nickel, gold, or of chromium, nickel, gold, and the like, may be formed on the mount substrate, from a viewpoint of the simplicity of the solder mounting in the subsequent step and the reliability of connection. The thickness at the time of forming the multilayer structure is for example 0.5 μm, 1 μm, and 0.2 μm, respectively.

Figure 7A:
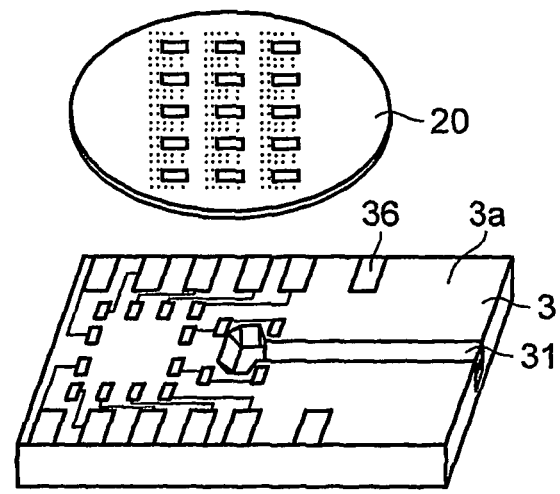
FIGS. 7A to 7B are illustrations explaining the manufacturing process of the photoelectric converter.

4) As shown in FIG. 7A, the internal waveguide 31 is formed in the groove 32 for waveguide formation. First, a clad material is filled in the groove 32 for waveguide formation. Subsequently, the clad material is pressed by using a metallic mold (not shown), so that a groove for core (not shown) is formed. Then, the groove for core is filled with a core material, so that the core 31a is formed. Finally, the clad 31b is formed by applying the clad material on the core 31a.

Note that the internal waveguide 31 can be formed without using the metallic mold. First, the whole silicon wafer 20 is oxidized by a pyro-oxidation furnace at 1100° C. for 250 minutes, so that a silicon oxide layer having a thickness of 1 to 2 μm is formed on the inner surface of the groove 32 for waveguide formation. Then, the core material is filled in the groove 32 for waveguide formation, so that the core 31a is formed. Further, a clad material having a refractive index close to that of the silicon oxide is applied on the core 31a, so that the clad 31b can be constituted by the silicon oxide layer and the clad material.

Figure 7B:
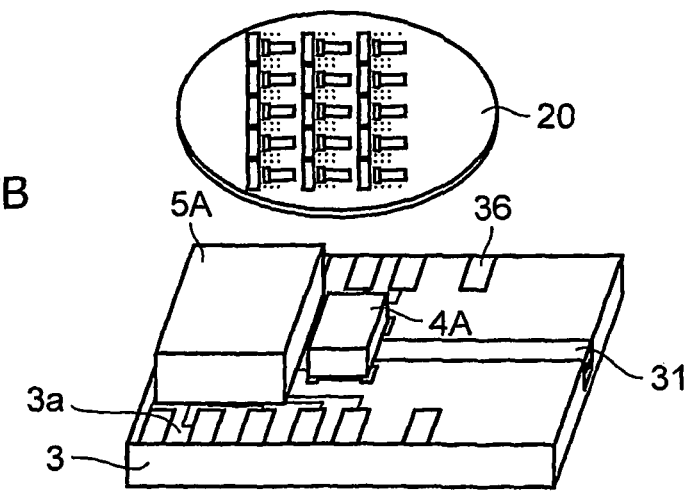

5) As shown in FIG. 7B, the light emitting element 4A and the IC substrate 5A are mounted on the silicon wafer 20. Bumps 11 are formed on the light emitting element 4A and the IC substrate 5A by stud bump bonding. The ultrasonic joining is performed by heating the silicon wafer 20, the light emitting element 4A, and the IC substrate 5A at 200° C.

Note that although not shown, after the light emitting element 4A and the IC substrate 5A are mounted, the strength of joining the mount substrate with the light emitting element 4A and the IC substrate 5A is reinforced by filling an underfill material between the light emitting element 4A and the mount substrate 3 and between the IC substrate 5A and the mount substrate 3. Further, the whole part may be sealed by a sealing material having an elastic property in order to improve the environmental resistance.

6) Thereafter, a flux is applied to the electrode portion of the wiring pattern 36, and the solder balls 10 are arranged. Then, the silicon wafer 20 is cut so as to be divided into individual mount substrates 3.

7) Finally, it is possible to manufacture the light emitting side photoelectric converting portion 1A1 by mounting the header 6 on the mount substrate 3 by means of the solder ball 10.

Then, as described above, the external waveguide 9 is joined to the light emitting side photoelectric converting portion 1A1 and the light receiving side photoelectric converting portion 1A2 which are manufactured in this way, so that the light emitting side photoelectric converting portion 1A1 and the light receiving side photoelectric converting portion 1A2 are optically connected to each other.

In the photoelectric converter 1A of the first embodiment, the header 6 is provided on the one surface 3a of the mount substrate 3 on which the light emitting element 4A or the light receiving element 4B is mounted, while the waveguide is constituted by the mirror portion 33, the internal waveguide 31 and the external waveguide 9, and the internal waveguide 31 is provided along the one surface 3a of the mount substrate 3. Thereby, it is possible to suppress the height of the device as a whole in the thickness direction of the mount substrate 3, and to achieve the low height of the device.

Further, the mount substrate 3 is a silicon substrate, and hence the mirror portion 33 and the internal waveguide 31 can be easily formed.

Note that in the first embodiment, as the photoelectric converter 1A, there is shown a one-way communication type in which an optical signal is sent from the light emitting side photoelectric converting portion 1A1 to the light receiving side photoelectric converting portion 1A2, but the photoelectric converter 1A may be a two-way communication type in which a light receiving element 4B is mounted in the light emitting side photoelectric converting portion 1A1, a light emitting element 4A is mounted in the light receiving side photoelectric converting portion 1A2, and a plurality of waveguides 31 are formed in the mount substrate 3. Further, the photoelectric converter 1A may be provided with an external waveguide 9 and at least one of the light emitting side photoelectric converting portion 1A1 and the light receiving side photoelectric converting portion 1A2. Further, one channel communication is explained in both the one-way communication type and the two-way (bidirectional) communication type. However, the photoelectric converter 1A may be a multi-channel communication type in which array type light emitting and receiving elements are mounted, and a plurality of wave guides may also be formed so as to be used as the external waveguide 9.

Further, various modifications are possible for the photoelectric converter 1A of the first embodiment. In the following, modified example 1 to modified example 5 of the photoelectric converter 1A are explained with reference to FIG. 9 to FIG. 13. However, in the modified examples, the light receiving side photoelectric converting portion is also the same as the light emitting side photoelectric converting portion, and hence only the light emitting side photoelectric converting portion is illustrated and explained.

Figure 9:
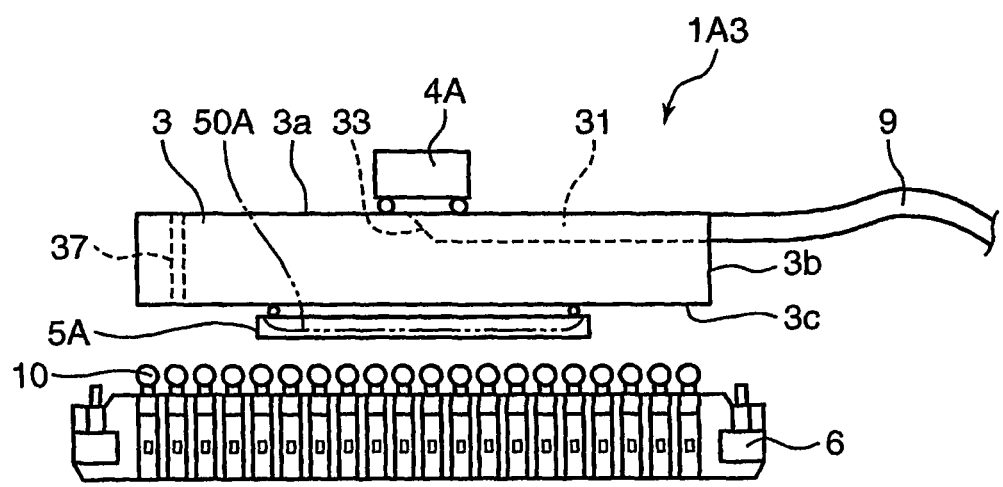
FIG. 9 is a figure schematically showing a constitution of a photoelectric converter of modified example 1.

In a light emitting side photoelectric converting portion 1A3 of modified example 1 shown in FIG. 9, the mount substrate 3 is arranged so that the one surface 3a on which the light emitting element 4A is mounted is set as the upper surface, and a through-electrode 37 which electrically connects a wiring pattern (not shown) formed on the one surface 3a to the wiring pattern (not shown) formed on the other surface 3c, is provided in the mount substrate 3. On the other surface 3c of the mount substrate 3, the IC substrate 5A is mounted, and the header 6 is provided. Thereby, it is possible to secure a mounting area by both the surfaces 3a and 3c of the mount substrate 3, and to miniaturize the mount substrate 3.

Figure 10A:
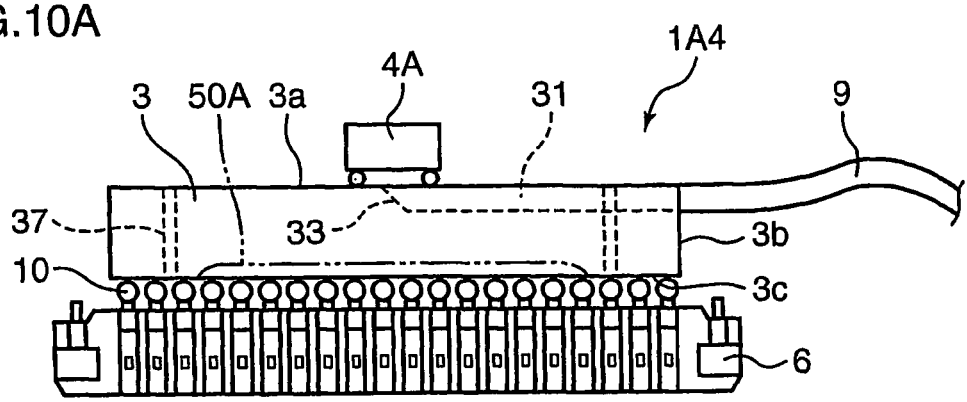
FIG. 10A to FIG. 10C are figures schematically showing a constitution of a photoelectric converter of modified example 2.

In a light emitting side photoelectric converting portion 1A4 of modified example 2 shown in FIG. 10A, similarly to modified example 1, the mount substrate 3 is arranged so as to set the one surface 3a as the upper surface, and the through-electrodes 37 are provided in the mount substrate 3. On the other side surface 3c of the mount substrate 3, the IC circuit 50A for transmitting an electric signal to the light emitting element 4A is directly formed, and the header 6 is provided. In other words, it is constituted such that the function of the IC substrate 5A is provided for the mount substrate 3. This makes it possible to miniaturize the device.

Figure 10B:
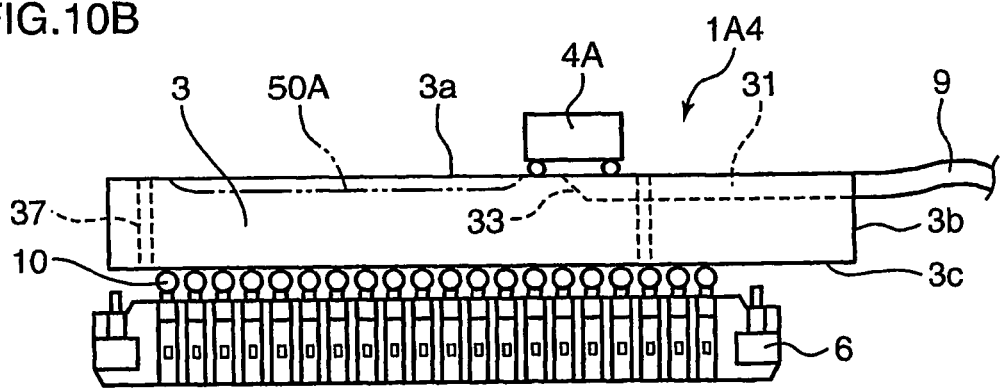
Figure 10C:
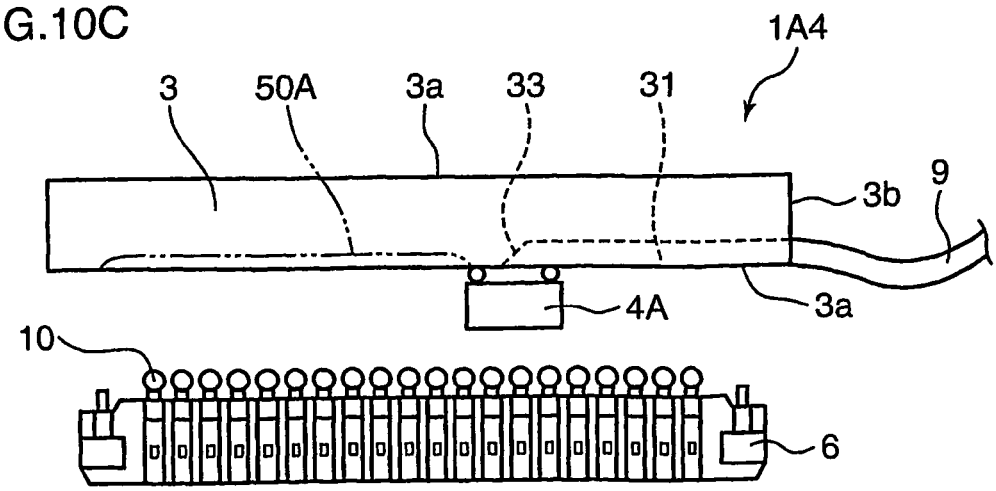

Note that the IC circuit 50A is not necessarily formed on the other surface 3c, and may also be formed on the one surface 3a as shown in FIG. 10B. Alternatively, as shown in FIG. 10C, the mount substrate 3 may be arranged so that the one surface 3a, on which the light emitting element 4A is mounted and the IC circuit 50A is formed, is set as the lower surface, and the header 6 is formed on the one surface 3a. This makes the through-electrode 37 unnecessary.

Figure 11A:
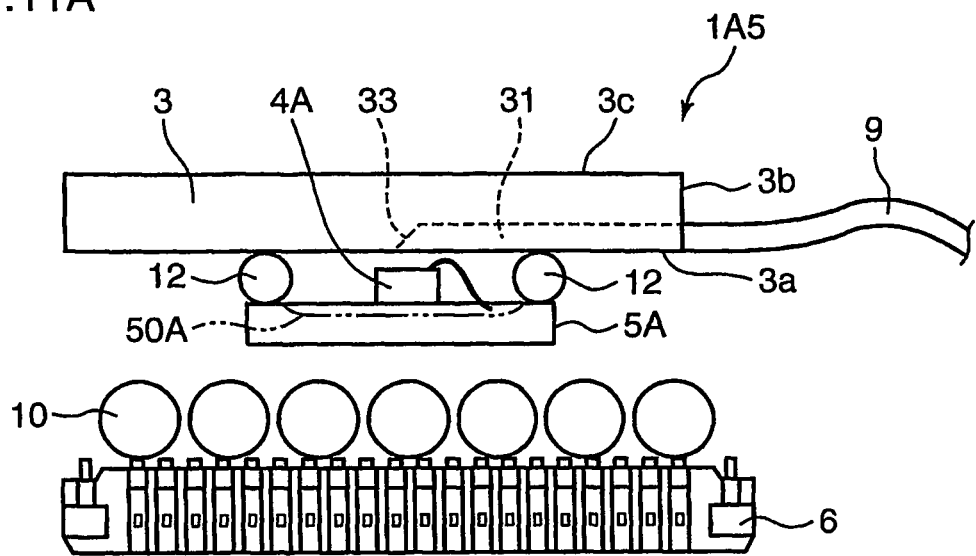
FIG. 11A and FIG. 11B are figures schematically showing a constitution of a photoelectric converter of modified example 3.

In a light emitting side photoelectric converting portion 1A5 of modified example 3 shown in FIG. 11A, the light emitting element 4A is mounted on the IC substrate 5A, and the IC substrate 5A is mounted on the one surface 3a of the mount substrate 3. That is, the light emitting element 4A is mounted on the one surface 3a of the mount substrate 3 via the IC substrate 5A. Specifically, the light emitting element 4A is mounted on the IC substrate 5A by the die bonding and the wire bonding. Further, the IC substrate 5A is connected to the wiring pattern (not shown) formed on the one surface 3a of the mount substrate 3 by solder bumps 12 in order to secure a predetermined gap between the IC substrate 5A and the mount substrates 3. The header 6 is mounted on the one surface 3a of the mount substrate 3 with somewhat larger solder balls 10, in order to secure a somewhat larger gap between the header 6 and the mount substrates 3.

Thereby, the IC substrate 5A can be mounted on the mount substrate 3 after the light emitting element 4A is mounted on the IC substrate 5A, so that alignment of the light emitting element 4A with respect to the mirror portion 33 can be performed afterwards.

Figure 11B:
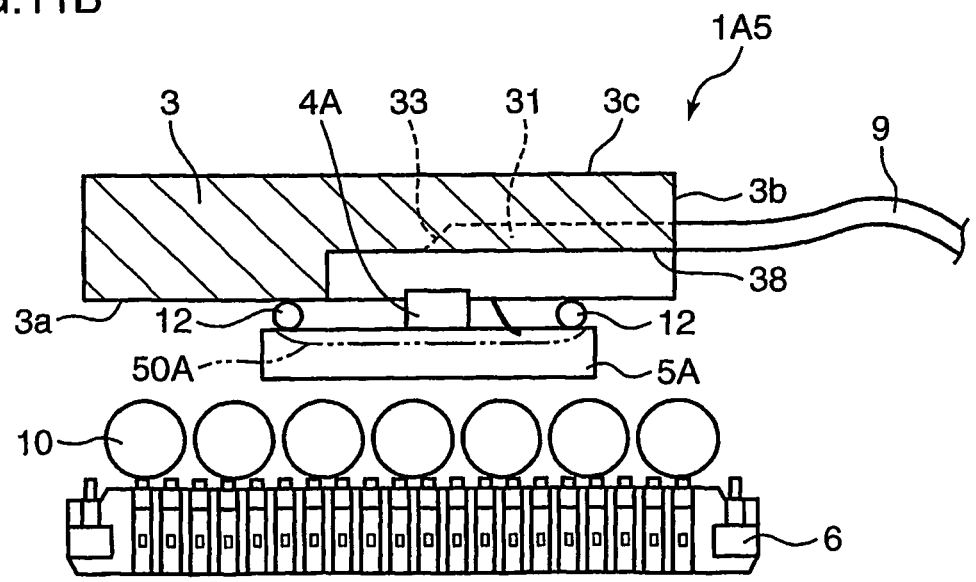

Note that as shown in FIG. 11B, a recessed portion 38 for preventing interference with the light emitting element 4A may be provided in the mount substrate 3, so that the waveguide 31 is formed on the bottom surface of the recessed portion 38.

Figure 12:
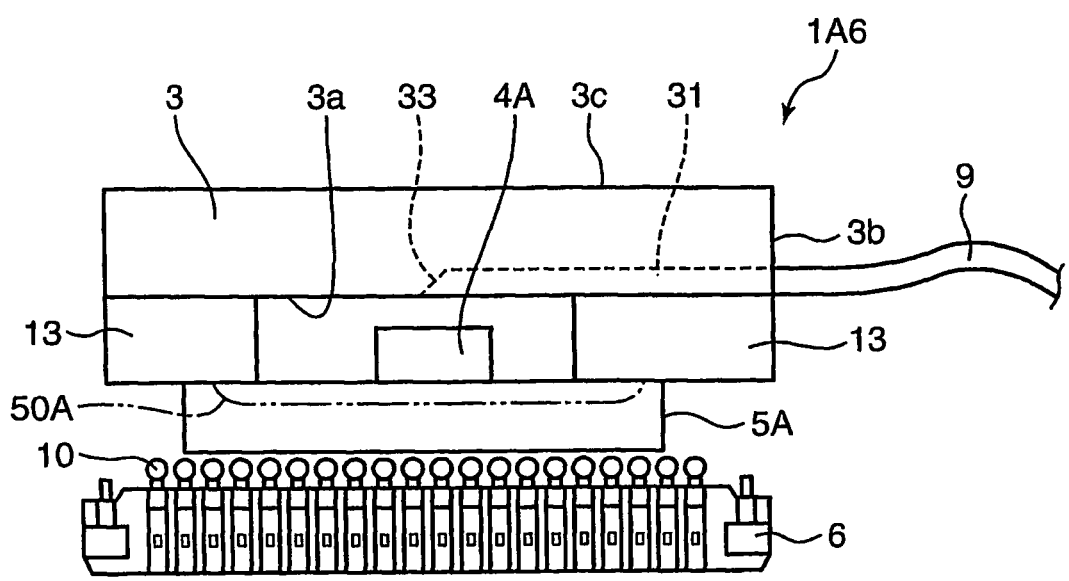
FIG. 12 is a figure schematically showing a constitution of a photoelectric converter of modified example 4.

In a light emitting side photoelectric converting portion 1A6 of modified example 4 shown in FIG. 12, resin structural portions 13 are formed at both the front and rear ends of the one surface 3a of the mount substrate 3, and the IC substrate 5A on which the light emitting element 4A is mounted is mounted on the mount substrate 3 via the resin structural portions 13. The header 6 is mounted on the lower surface of the IC substrate 5A with the solder balls 10, and the header 6 is provided on the one surface 3a of the mount substrate 3 via the IC substrate 5A and the resin structural portions 13. Thereby, it is also possible to form a portion for positioning the IC substrate 5A on the resin structural portions 13, which makes it possible to perform positioning of the mirror portion 33 and the light emitting element 4A with high precision.

Figure 13:
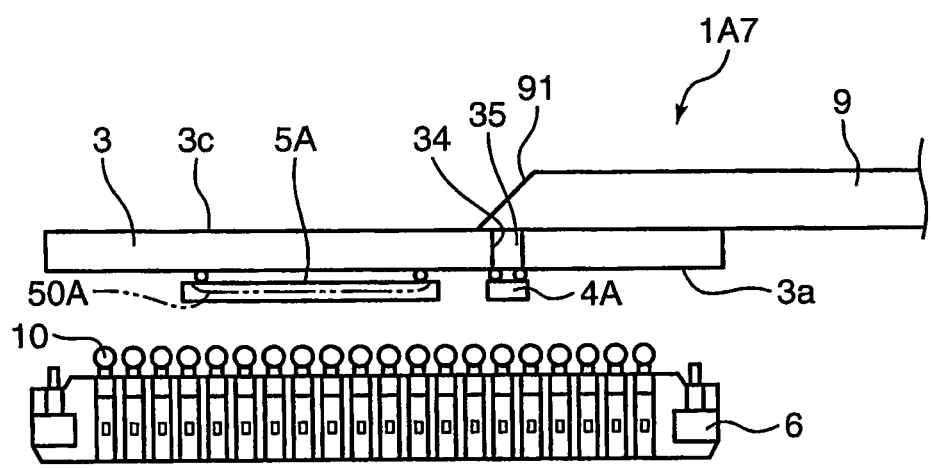
FIG. 13 is a figure schematically showing a constitution of a photoelectric converter of modified example 5.

In a light emitting side photoelectric converting portion 1A7 of modified example 5 shown in FIG. 13, a through hole 34 is provided at a position corresponding to the light emitting element 4A on the mount substrate 3, and an optically transmissive resin is filled in the through hole 34 so that an auxiliary waveguide 35 is formed. The header 6 is provided on the one surface 3a of the mount substrate 3, and the external waveguide 9 is joined to the other surface 3c of the mount substrate 3.

The external waveguide 9 is provided along the other surface 3c by being joined to the other surface 3c of the mount substrate 3. Further, the end of the external waveguide 9 is arranged just above the waveguide 35, and a mirror surface 91 is formed at the end by cutting the end at an angle of 45 degrees. The light emitted from the light emitting element 4A enters into the external waveguide 9 through the waveguide 35, and is transmitted by the external waveguide 9 after the optical path of the light is converted by the mirror surface 91 by 90 degrees. That is, in modified example 5, the waveguide according to the present invention is constituted only by the external waveguide 9.

Even in this manner, it is also possible to achieve the low height of the whole device. However, with the constitution shown in FIG. 1 to FIG. 12, it is possible to make the height of the device lower than that in the constitution shown in FIG. 13.

Note that it is known that a high speed transmission element often generates a noise, but when the mount substrate 3 is arranged so as to cover the light emitting element 4A as shown in FIG. 1, FIG. 10C, FIG. 11, FIG. 12 and FIG. 13, the mount substrate 3 serves as the ground to provide an effect of suppressing the noise.

Next, a photoelectric converter 1B according to a second embodiment of the present invention is explained with reference to FIG. 14 to FIG. 17. Note that also in the second embodiment and subsequent embodiments, the light receiving side photoelectric converting portion is the same as the light emitting side photoelectric converting portion, and hence only the light emitting side photoelectric converting portion is illustrated and explained. Further, components which are the same as those of the first embodiment are denoted by the same reference numerals and characters, and the explanation thereof is omitted.

Figure 14A:
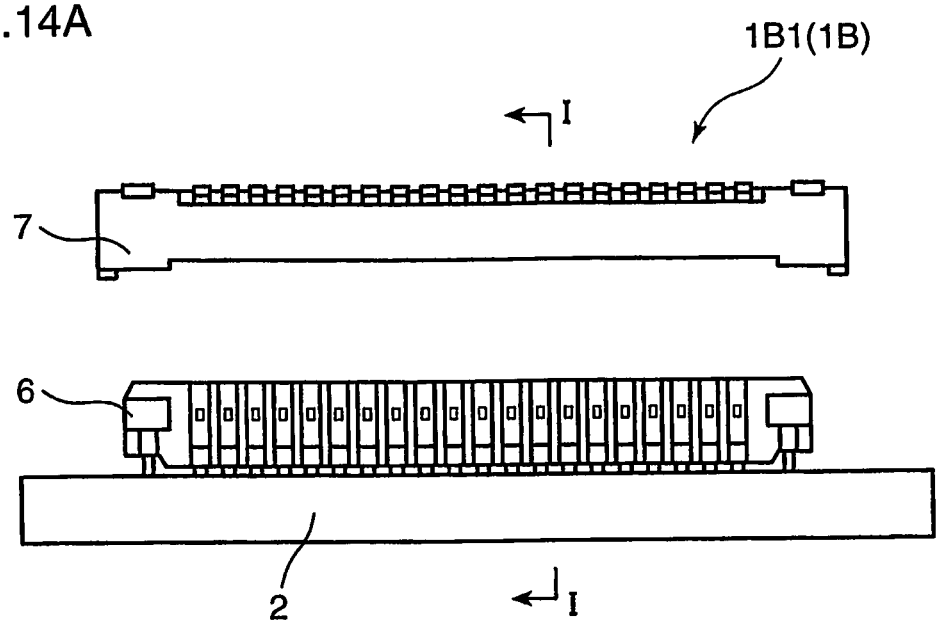
FIG. 14A is a figure schematically showing a constitution of a photoelectric converter and a wiring substrate, according to a second embodiment of the present invention.
Figure 14B:
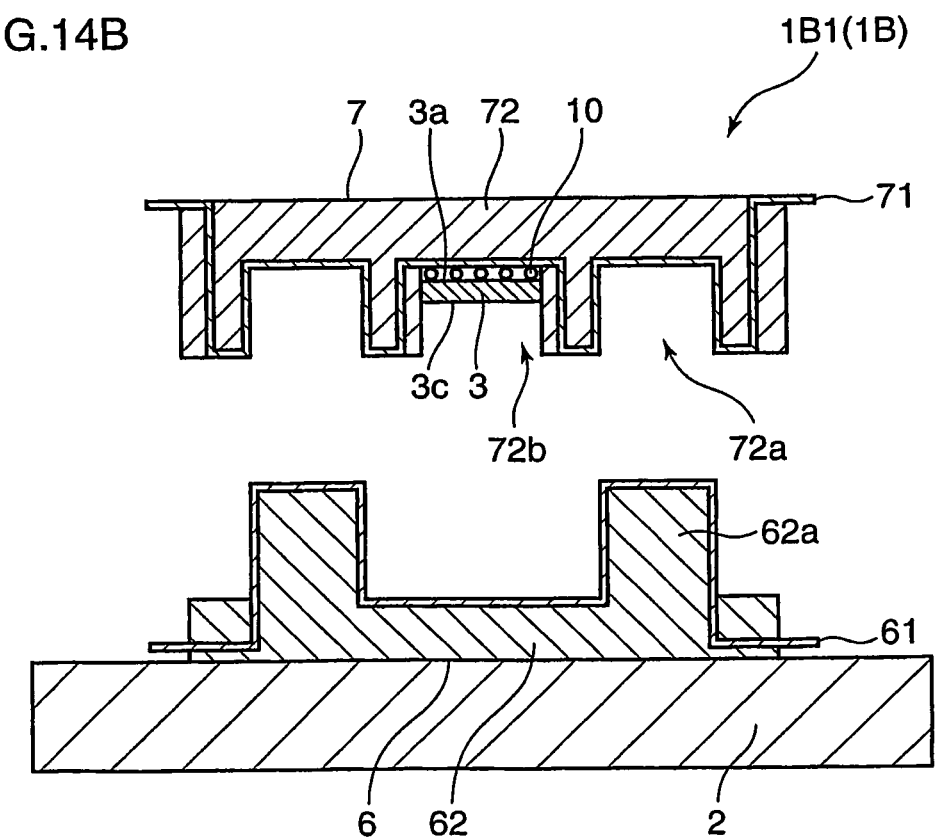
FIG. 14B is a sectional end view along the line I-I in FIG. 14A.
Figure 15:
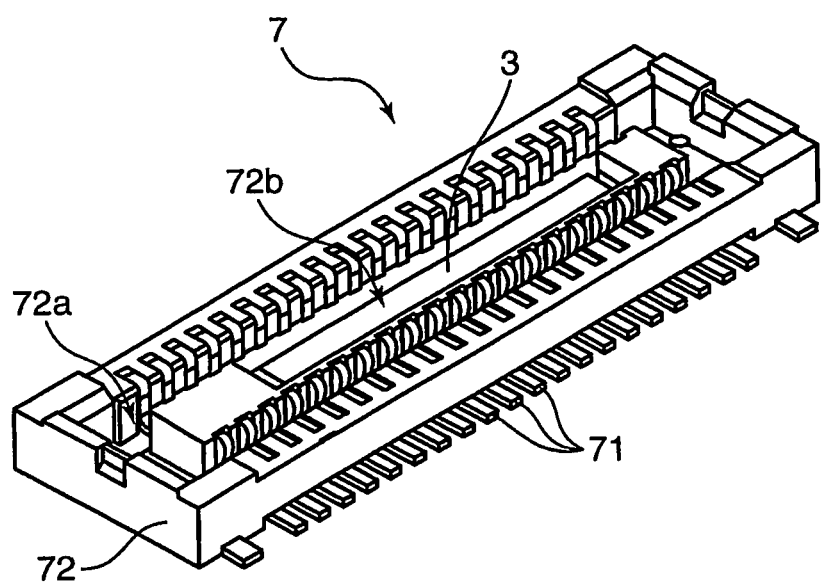
FIG. 15 is a perspective view of a socket type electric connector.

In a constitution shown in FIG. 14 and FIG. 15, the header 6 is provided on the wiring substrate 2, and the socket 7 is provided on the mount substrate 3 of a light emitting side photoelectric converting portion 1B1.

More particularly, in the socket body 72 of the socket 7, a rectangular recessed portion 72b extending in the front and rear direction in bottom view is provided in a part surrounded by the fitting recess 72a, and the terminal 71 is exposed on the bottom surface of the recessed portion 72b.

On the other hand, the mount substrate 3 is arranged so that the one surface 3a on which the light emitting element 4A is mounted is set as the upper surface. In a state where the mount substrate 3 is fit into the recessed portion 72b of the socket 7, the bottom surface of the recessed portion 72b is joined to the one surface 3a of the mount substrate 3 by connecting the terminal 71 exposed on the bottom surface of the recessed portion 72b to the circuit pattern (not shown) formed on the one surface 3a of the mount substrate 3 with the solder balls 10.

In this way, when the recessed portion 72b in which the mount substrate 3 can be fit is provided in the socket 7, it is possible to achieve the lower height of the device.

Note that by providing the through-electrode 37 in the mount substrate 3 similarly to embodiment 1, it is also possible to arrange the mount substrate 3 so that the one surface 3a thereof is set as the lower surface, and the bottom surface of the recessed portion 72b of the socket 7 is joined to the other surface 3c of the mount substrate 3. Further, it is also possible to apply modified example 2 to modified example 5 which are shown in the first embodiment.

Figure 16A:
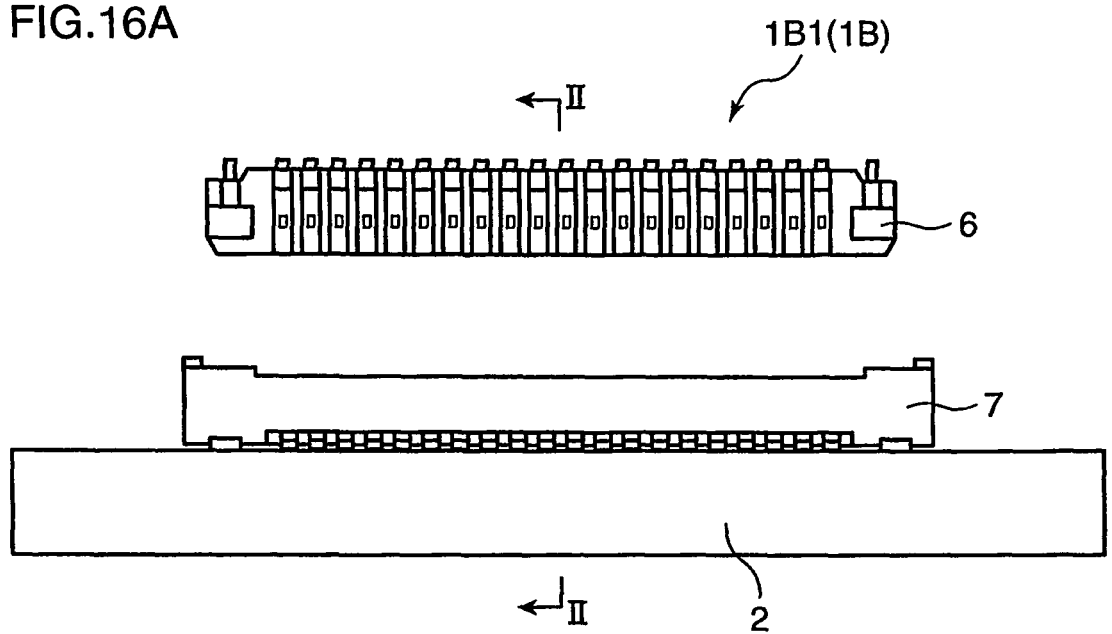
FIG. 16A is a figure schematically showing a constitution of a photoelectric converter and a wiring substrate of a modified example.
Figure 16B:
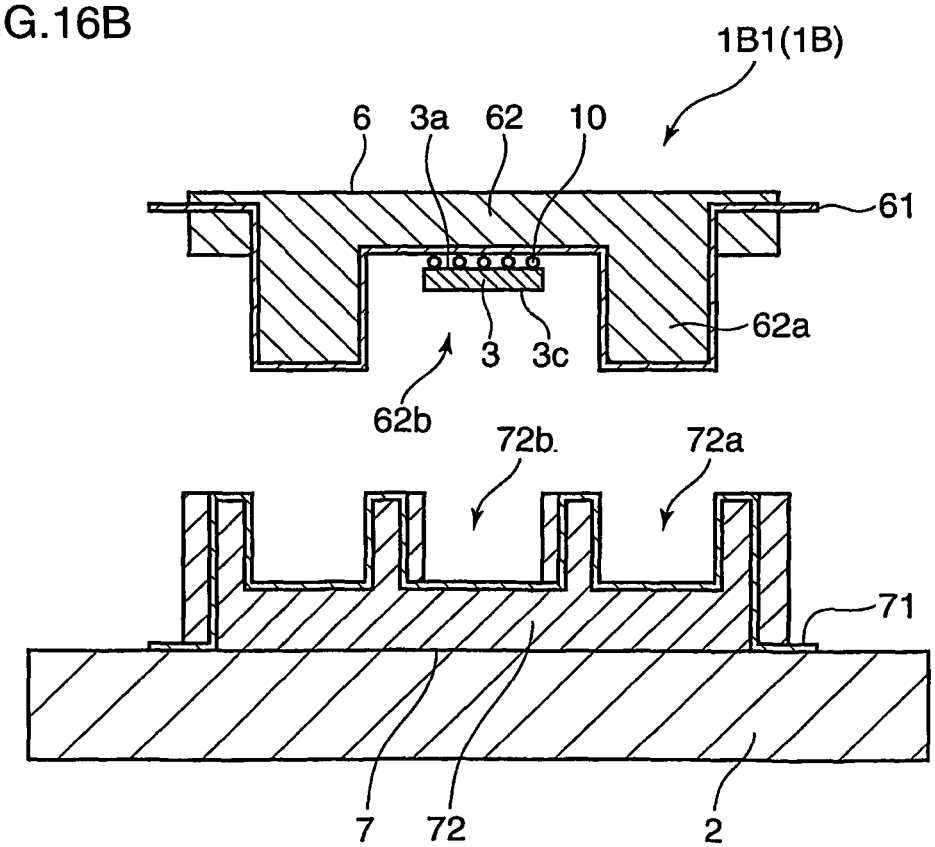
FIG. 16B is a sectional end view along the line II-II in FIG. 16A.
Figure 17:
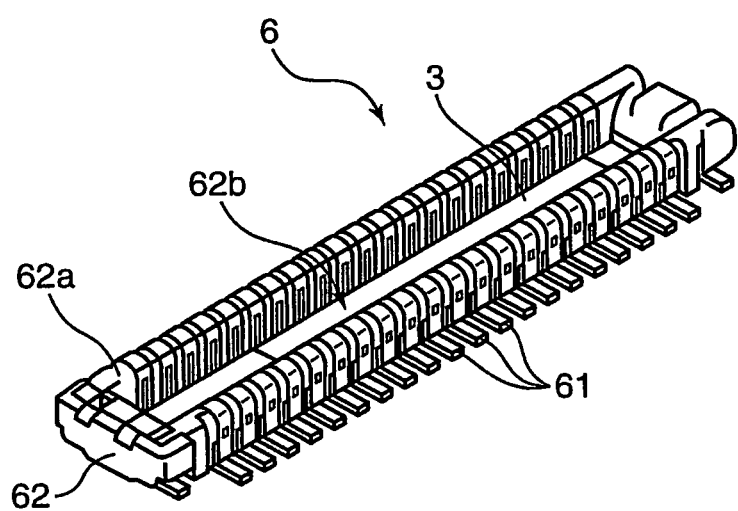
FIG. 17 is a perspective view of a header type electric connector.

Further, as shown in FIG. 16 and FIG. 17, the socket 7 may be provided on the wiring substrate 2, so that the header 6 is provided on the mount substrate 3 of the light emitting side photoelectric converting portion 1B1. In this case, the terminal 61 may be exposed on the bottom surface of a recessed portion 62b which is formed by being surrounded by the fitting protrusions 62a of the header body 62 of the header 6, and the terminal 61 may be connected to the wiring pattern (not shown) of the one surface 3a of the mount substrate 3 with the solder balls 10. However, the recessed portion 72b is provided in the socket body 72 of the socket 7 in order to avoid the interference with the mount substrate 3.

Figure 18:
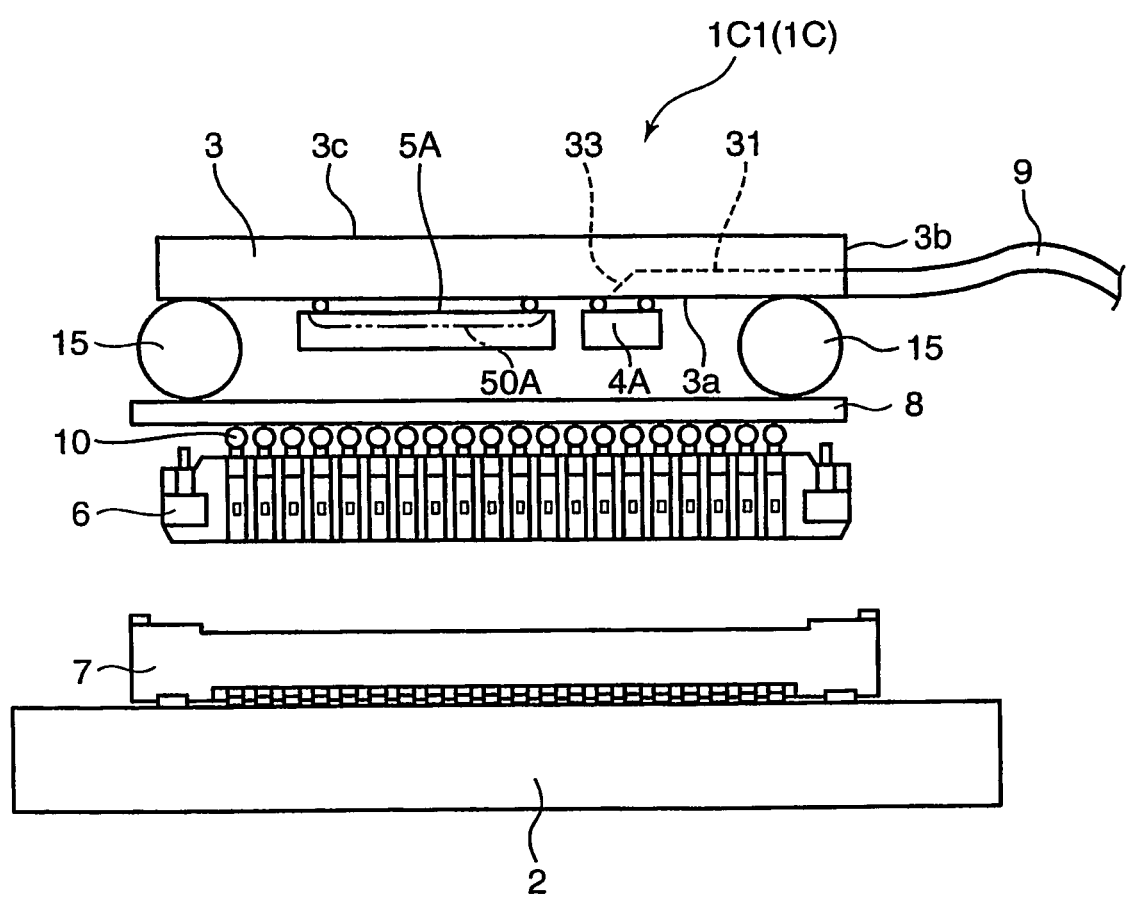
FIG. 18 is a figure schematically showing a constitution of a photoelectric converter and a wiring substrate, according to a third embodiment of the present invention.

Next, a photoelectric converter 1C according to a third embodiment of the present invention is shown in FIG. 18. In the light emitting side photoelectric converting portion 1C1 of the third embodiment, an interposer substrate (wiring substrate) 8 is interposed between the one surface 3a of the mount substrate 3 and the header 6. That is, the upper surface of the interposer substrate 8 is connected to the one surface 3a of the mount substrate 3 with solder balls 15, and the header 6 is connected to the lower surface of the interposer substrate 8 with the solder balls 10.

Figure 19A:
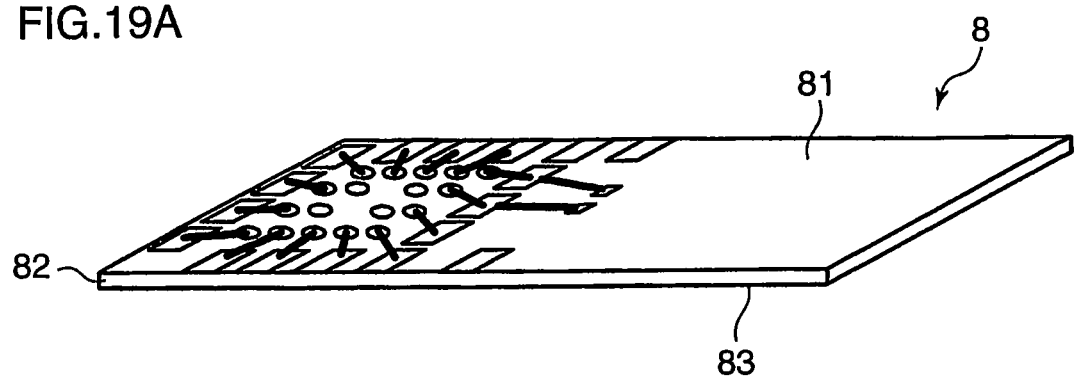
FIG. 19A is a perspective view of an interposer substrate viewed from above.
Figure 19B:
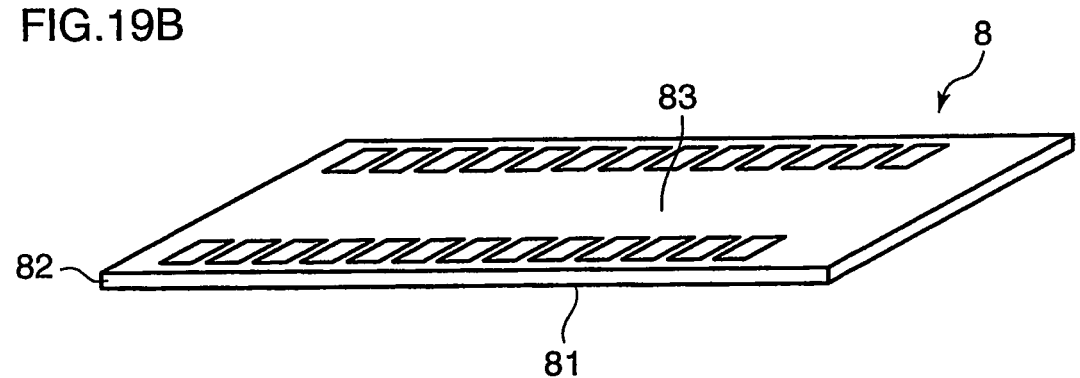
FIG. 19B is a perspective view of the interposer substrate viewed from below.

The interposer substrate 8 is constituted by a multilayer board, in such a manner that as shown in FIG. 19, electrodes are formed on the uppermost layer 81 in correspondence with the wiring pattern (not shown) formed on the one surface 3a of the mount substrate 3, and electrodes are formed on the lowermost layer 83 in correspondence with the terminals 61 of the header 6, and that by electrically connecting the electrodes on the uppermost layer and the electrodes on the lowermost layer by an intermediate layer 82, the electrode pitch is converted and thereby the electrode pattern is changed.

Note that the number of electrodes on the uppermost layer 81 and the number of electrodes on the lowermost layer 83 are not necessarily adapted to correspond to one to one in the interposer substrate 8, and it is also possible to make the electrodes on the uppermost layer 81 collected into one and electrically connected to the electrodes of the lowermost layer 83. Therefore, it is also possible to reduce the number of terminals of the header 6 and the socket 7 by collecting the electric lines by using the interposer substrate 8.

In this way, it is possible to improve the flexibility of the wiring pattern of the mount substrate 3 by using the interposer substrate 8. That is, since the light emitting element 4A and the IC substrate 5A are mounted on the mount substrate 3, it may be difficult to make the electrode portion of the wiring pattern 36 of the mount substrate 3 coincident with the terminal 61 of the header 6. In such case, the interposer substrate 8 is particularly effective.

Note that similarly to modified example 1 of the first embodiment, in a state where the one surface 3a is set as the upper surface, the mount substrate 3 may be arranged so that the interposer substrate 8 is interposed between the other surface 3c of the mount substrate 3 and the header 6. Further, it is also possible to apply modified example 2 to modified example 5 which are shown in the first embodiment.

Further, similarly to the first and second embodiments, the header 6 and the socket 7 are replaceable with each other. This is the same as in third to fifth embodiments as will be described below.

Figure 20:
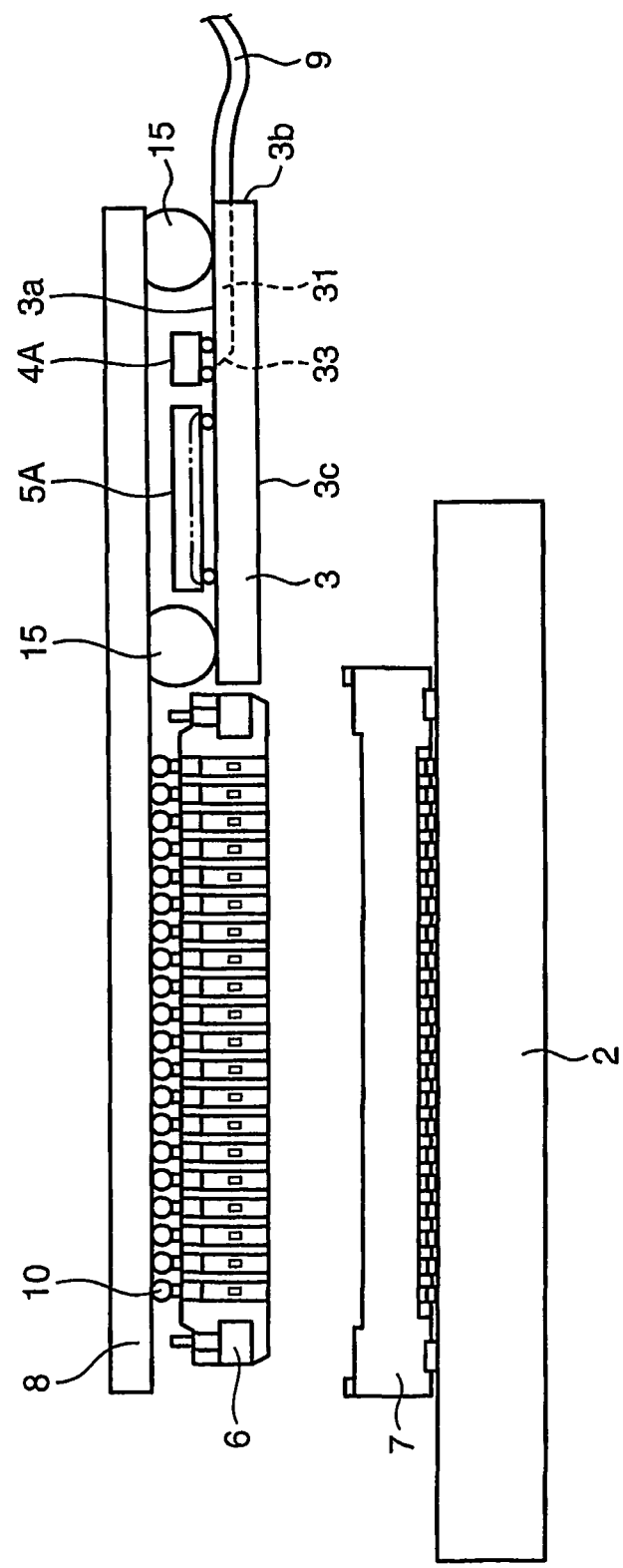
FIG. 20 is a figure schematically showing a constitution of a photoelectric converter and a wiring substrate of a modified example.

Further, as shown in FIG. 20, the interposer substrate 8 is not necessarily interposed between the mount substrate 3 and the header 6. The header 6 and the mount substrate 3 may be arranged side by side, and mounted on the interposer substrate 8 so that the interposer substrate 8 is arranged to extend over the header 6 and the mount substrate 3. Thereby, the whole size is increased but the dimension in the thickness direction is reduced, which is effective for mobile devices, such as a cellular phone which has a limitation in the thickness direction.

Next, a photoelectric converter 1D according to a fourth embodiment of the present invention is shown in FIG. 21. In the photoelectric converter 1D of the fourth embodiment, a flexible electric circuit film 14 is stuck on the lower surface of the external waveguide 9.

As shown in FIG. 22, the electric circuit film 14 is adapted to hold, by an insulating material, conductive lines 14a for transmitting power from the light emitting side photoelectric converting portion 1D1 to the light receiving side photoelectric converting portion (not shown), or for receiving power by the light emitting side photoelectric converting portion 1D1 from the light receiving side photoelectric converting portion. Note that it is possible to transmit or receive not only power but also various signals by the conductive lines 14a.

The whole length of the electric circuit film 14 is set longer than the length of the external waveguide 9, so that both ends 141 of the electric circuit film 14 extend from the external waveguide 9 in the front and rear direction. Also, it is adapted such that when the external waveguide 9 is joined to the front end surface 3b of the mount substrate 3, the end 141 of the electric circuit film 14 overlaps the one surface 3a of the mount substrate 3.

Further, the end 141 of the electric circuit film 14 is connected to the header 6, and the conductive lines 14a are directly connected to the header 6. Specifically, the conductive lines 14a are connected to the terminal 61 of the header 6 with the solder balls 10. Note that a conductor such as a copper post can also be used for this connection, besides the solder ball 10.

Thereby, it is possible to perform electric wiring between the light emitting side photoelectric converting portion 1D1 and the light receiving side photoelectric converting portion (not shown) by using the external waveguide 9. Further, the conductive lines 14a are directly connected to the header 6, which makes it possible to perform the electric connection for electric signals and the electric connection for power transmission or reception by the single header 6.

Note that in the fourth embodiment, it is also possible to apply modified example 1 to modified example 5 which are shown in the first embodiment.

Next, a photoelectric converter 1E according to a fifth embodiment of the present invention is shown in FIG. 23. The photoelectric converter 1E of the fifth embodiment has substantially the same constitution as that of the photoelectric converter 1C of the third embodiment, but is different from the photoelectric converter 1C in that the interposer substrate 8 of the light emitting side photoelectric converting portion 1E1 is extended in the direction in which the external waveguide 9 is extended, so as to be integrated with the interposer substrate 8 of the light receiving side photoelectric converting portion (not shown).

The interposer substrate 8 may be constituted as a freely bendable flexible wiring film, or constituted in such a manner that a portion interposed between the header 6 and the mount substrate 3 is constituted by a substrate having a strength, and the flexible film is connected to the end surface of the interposed portion. In the interposer substrate 8, there is formed an electric circuit for transmitting power from the light emitting side photoelectric converting portion 1E1 to the light receiving side photoelectric converting portion or for receiving power by the light emitting side photoelectric converting portion 1E1 from the light receiving side photoelectric converting portion. Note that the electric circuit is capable of transmitting or receiving not only power but also various signals.

Thereby, it is possible to perform electric wiring between the light emitting side photoelectric converting portion 1E1 and the light receiving side photoelectric converting portion (not shown) by using the interposer substrate 8. Further, the interposer substrate 8 is adapted to be a flexible substrate, and hence the interposer substrate 8 can be bent together with the external waveguide 9. Also, only a gap corresponding to the solder ball 15 is provided between the external waveguide 9 and the interposer substrate 8. Thus, the external waveguide 9 and the interposer substrate 8 can be superposed and handled like the same film, without deteriorating the handling property. Further, these are independently provided, so that it is possible to obtain an excellent bending property.

Further, in the fifth embodiment, it is also possible to apply modified example 1 to modified example 5 which are shown in the first embodiment.

Further, in the first to fifth embodiments as described above, it is also possible to apply the following modified examples.

Figure 24A:
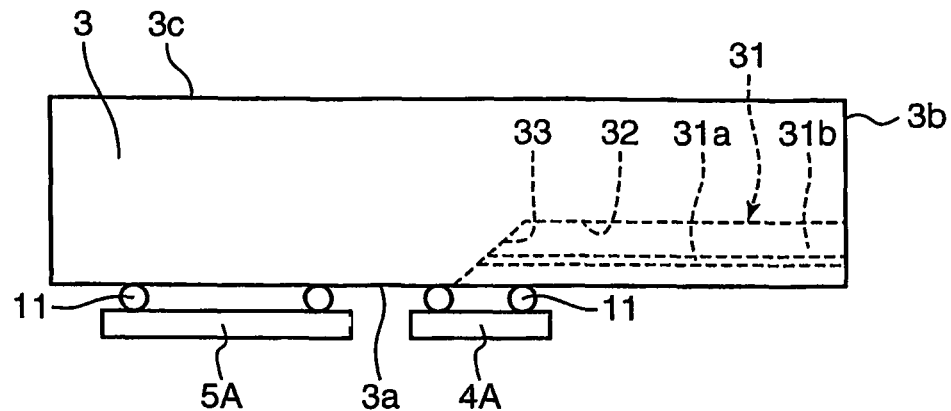
FIG. 24A is a side view of a mount substrate of a modified example.
Figure 24B:
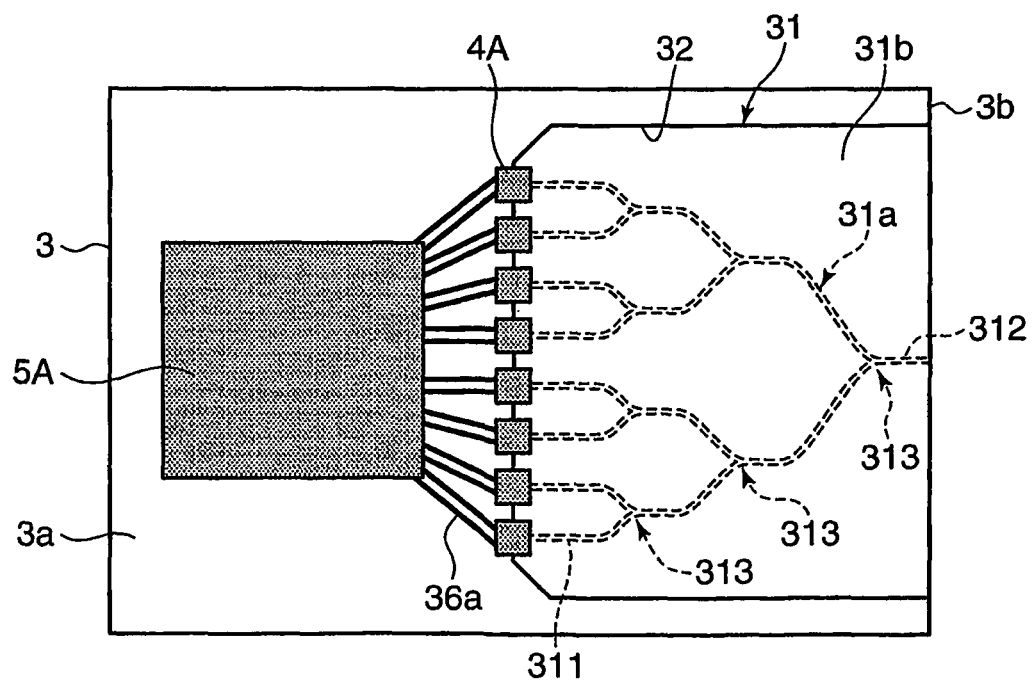
FIG. 24B is a bottom view of the mount substrate of the modified example.

First, as shown in FIG. 24A and FIG. 24B, a plurality of light emitting elements 4A (eight in the figure), each of which emits a light beam of a different wavelength, are mounted side by side in the right and left direction on the one surface 3a of the mount substrate 3, and the width of the internal waveguide 31 is increased by increasing the groove width of the groove for waveguide formation. Note that the cross sectional shape of the groove 32 for waveguide formation has substantially a trapezoidal shape similar to that explained with reference to FIG. 8C and FIG. 8D.

Also, a plurality of incident portions 311 each of which is optically coupled to each of the light emitting elements 4A and an emitting portion 312 connected to the incident portions 311 are provided in the internal waveguide 31. Specifically, a plurality of branches 313 are provided for the core 31a of the internal waveguide 31, so as to make the core 31 successively branched from the emitting side toward the incident side, that is to say, from the front end surface 3b side of the mount substrate 3 toward the rear.

Thereby, the light beams having a plurality of different wavelengths are superimposed and propagated by the internal waveguide 31, which makes it possible to significantly increase the amount of data which can be transmitted by one device.

Figure 25A:
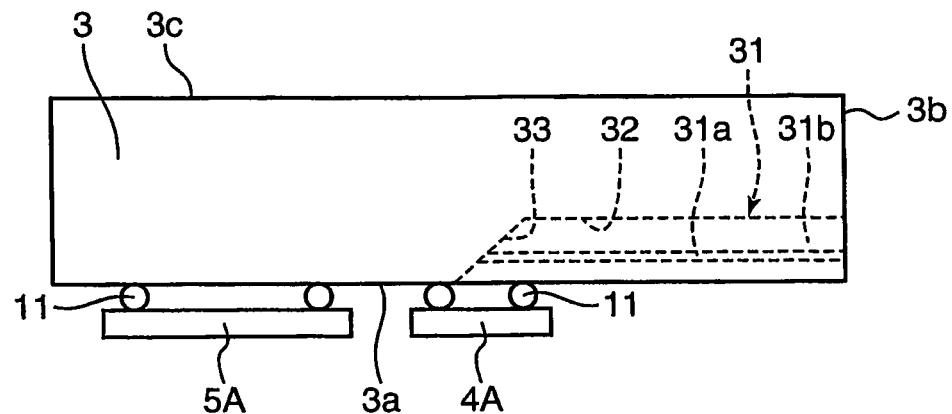
FIG. 25A is a side view of a mount substrate of a modified example.
Figure 25B:
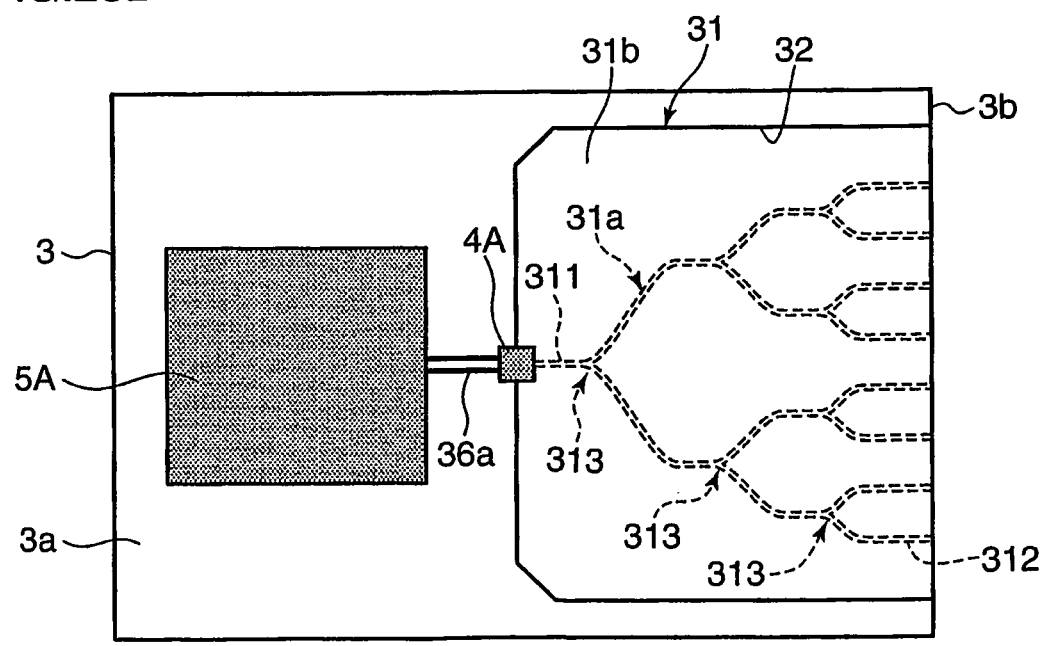
FIG. 25B is a bottom view of the mount substrate of the modified example.

Alternatively, as shown in FIG. 25A and FIG. 25B, an incident portion 311 which optically couples the light emitting element 4A to the internal waveguide 31 and a plurality of emitting portions 312 (eight in the figure) which are connected to the incident portion 311 are provided in the internal waveguide 31, while the one light emitting element 4A remains to be mounted on the one surface 3a of the mount substrate 3. Specifically, a plurality of branches 313 are provided for the core 31a of the internal waveguide 31, so as to make the core 31a successively branched from the incident side toward the emitting side, that is to say, from the rear of the mount substrate 3 toward the front end surface 3b of the mount substrate 3.

Thereby, a light beam emitted by the light emitting element 4A is distributed and propagated by the internal waveguide 31, which enables one-to-many data transmission.

Figure 26:
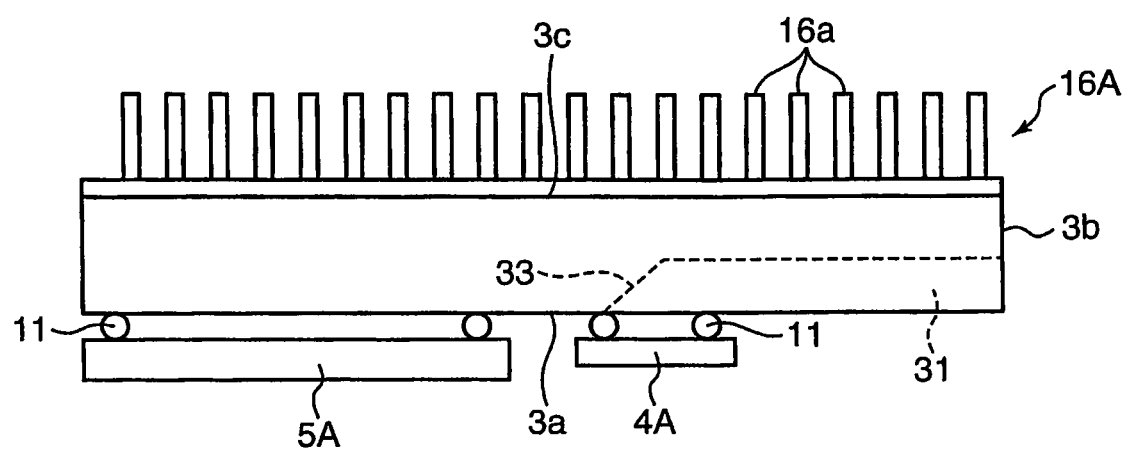
FIG. 26 is a side view of a mount substrate of a modified example.

Second, as shown in FIG. 26, a heat-dissipating member (heat dissipating means:heat sink) 16A having an upper surface, on which projecting lines of heat-dissipating fin 16a extending in the right and left direction are arranged in the front and rear direction, is joined to the other surface 3c opposite the one surface 3a of the mount substrate 3 on which the light emitting element 4A is mounted, so as to allow the heat generated by the light emitting element 4A and the IC substrate 5A to be dissipated by the heat-dissipating member 16A.

Thereby, it is possible to suppress the effect due to the heat generated by the light emitting element 4A and the IC substrate 5A.

Alternatively, the mount substrate 3 may be constituted by silicon nitride having good thermal conductivity instead of silicon, so that the mount substrate 3 itself is used as the heat dissipating means. Whereas silicon has a thermal conductivity of 160 W/mK, silicon nitride has a thermal conductivity of 200 W/mK and hence makes it possible that the heat generated by the light emitting element 4A and the IC substrate 5A is conducted to the other surface 3c of the mount substrate 3 so as to be excellently dissipated.

In this case, it is also possible to provide the heat-dissipating fin 16a on the other surface 3c by processing the mount substrate 3 itself. Thereby, it is possible to effect more excellent heat dissipation.

Figure 27A:
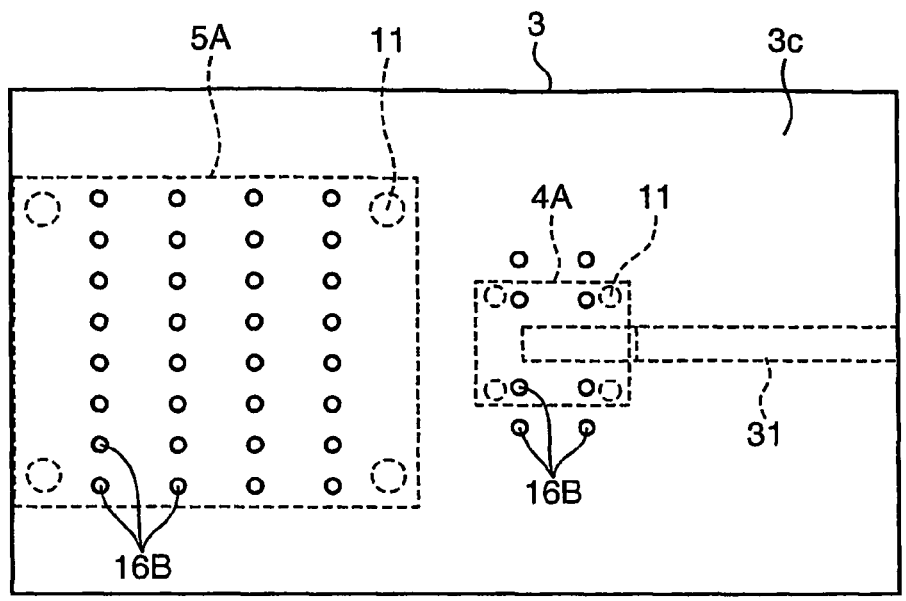
FIG. 27A is a plan view of a mount substrate of a modified example.
Figure 27B:
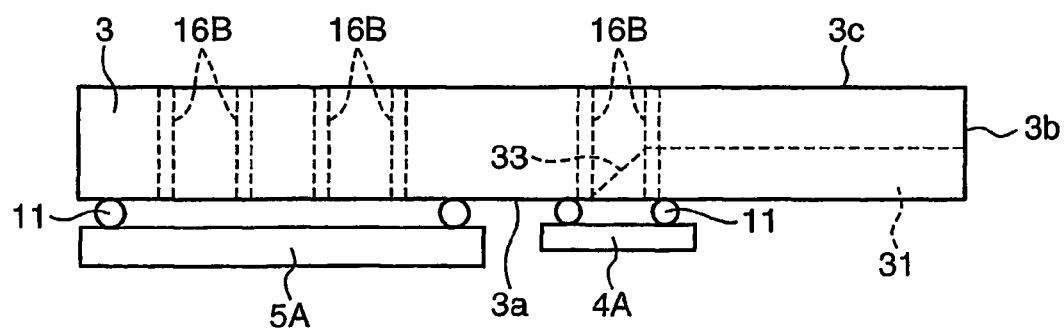
FIG. 27B is a side view of the mount substrate of the modified example.

Alternatively, as shown in FIG. 27A and FIG. 27B, a plurality of thermal via 16B may be provided in the mount substrate 3, so that the heat generated by the light emitting element 4A and the IC substrate 5A is dissipated by the thermal via 16B. Here, the thermal via 16B is formed by filling a metal, such as copper, having high thermal conductivity in a through hole.

Figure 28:
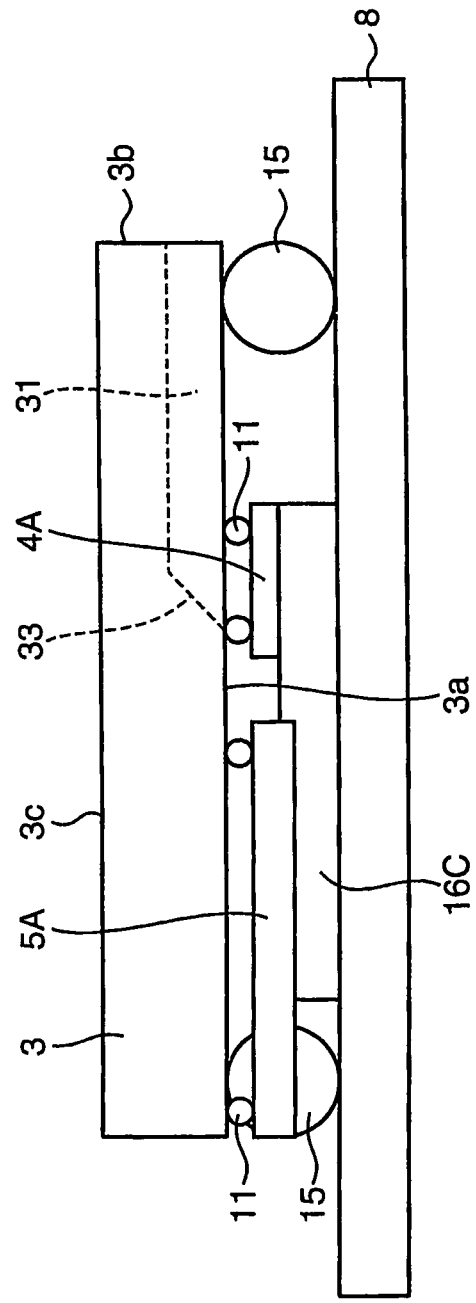
FIG. 28 is a side view of a mount substrate of a modified example.

Alternatively, in the case where as in the third embodiment and the fifth embodiment, the interposer substrate 8 is provided and arranged on the side of the one surface 3a of the mount substrate 3, as shown in FIG. 28, a heat dissipating component 16C constituted by a material, such as copper, having a relatively high thermal conductivity may also be provided between the interposer substrate 8 and both of the light emitting elements 4A and the IC substrates 5A which are mounted on the one surface 3a of the mount substrate 3, so that the heat dissipating component 16C is in contact with the interposer substrate 8 and both of the light emitting element 4A and the IC substrate 5A.

Thereby, the heat generated by the light emitting element 4A and the IC substrate 5A is conducted to the interposer substrate 8 via the heat dissipating component 16C so as to be dissipated. As a result, it is possible to dissipate the heat generated by the light emitting element 4A and the IC substrate 5A by rationally utilizing the interposer substrate 8.

Note that the heat dissipating component 16C needs only be in contact with the interposer substrate 8 and at least one of the light emitting element 4A and the IC substrate 5A, and hence, for example, the heat dissipating component 16C may be adapted to be in contact only with the interposer substrate 8 and the light emitting element 4A.

Figure 29A:
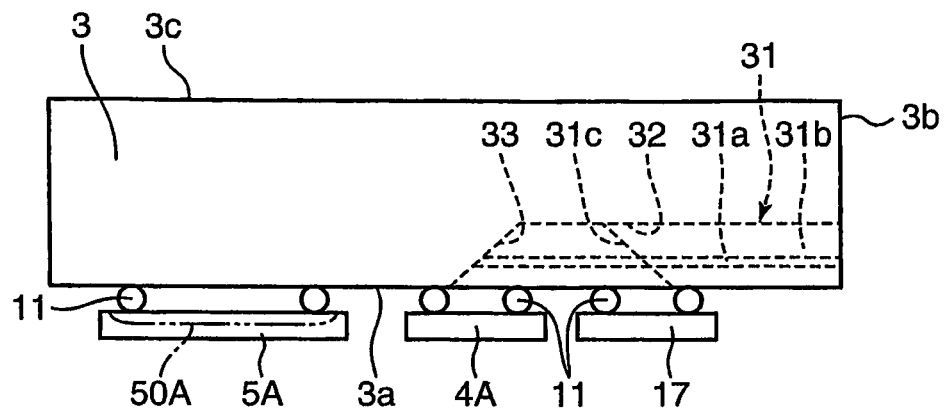
FIG. 29A is a side view of a mount substrate of a modified example.
Figure 29B:
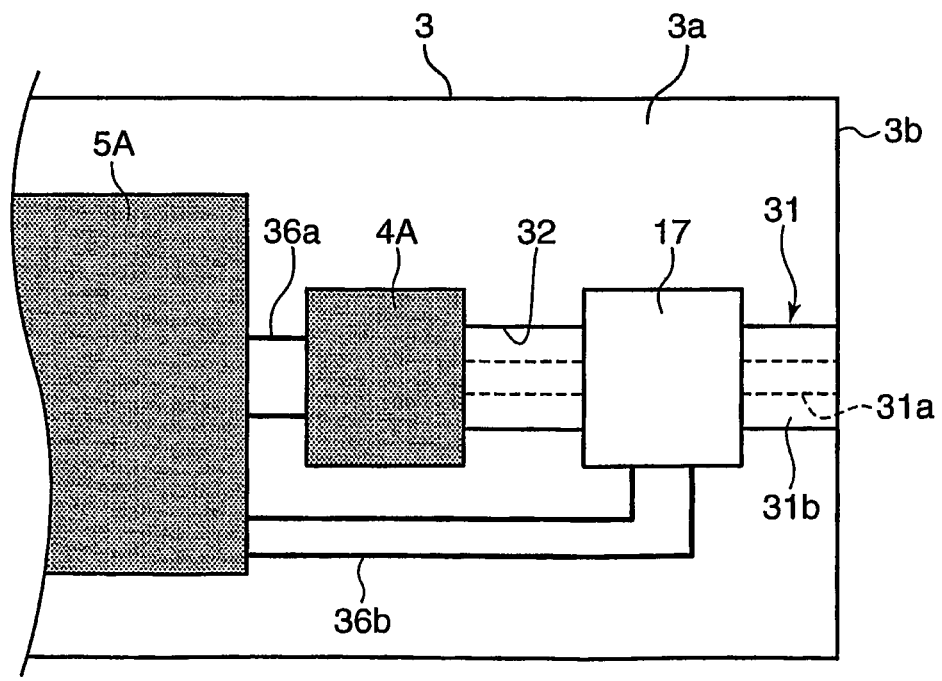
FIG. 29B is a bottom view of the mount substrate of the modified example.

Third, as shown in FIG. 29A and FIG. 29B, a half mirror portion 31c inclined in the direction substantially perpendicular to the mirror portion 33 is provided in the middle of the internal waveguide 31, and a light receiving element 17 for monitoring is mounted at a position corresponding to the half mirror portion 31c, on the one surface 3a of the mount substrate 3. The provision of the half mirror portion 31c in the middle of the internal waveguide 31 may be effected by forming a slit in the internal waveguide 31 and inserting the half mirror in the slit.

The half mirror portion 31c reflects several percent of the light which is emitted by the light emitting element 4A and reflected by the mirror portion 33, and transmits the rest of the light. For this reason, a part of the light emitted by the light emitting element 4A is received by the light receiving element 17 for monitoring. The light receiving element 17 for monitoring outputs the output of the light emitting element 4A as a monitor signal by receiving the light in this way. Note that besides providing the half mirror portion 31c, it may be adapted such that a protrusion (not shown) is provided in the groove 32 for waveguide formation, and the leading edge of the protrusion is constituted as a mirror so as to intrude into the core 31a, thereby making a part of the light waveguided by the core 31a reflected to the light receiving element 17 for monitoring by the leading edge of the protrusion.

The monitor signal output from the light receiving element 17 for monitoring is sent to the IC substrate 5A via a wiring pattern 36b formed on the one surface 3a of the mount substrate 3.

The IC circuit 50A formed in the IC substrate 5A includes a control circuit (not shown) which adjusts the electric signal transmitted to the light emitting element 4A via a wiring pattern 36a. On the basis of the monitor signal output from the light receiving element 17 for monitoring, the control circuit adjusts the electric signal so as to make the output of the light emitting element 4A constant.

Thereby, it is possible to make the output of the light emitting element 4A constant, without being influenced by the environment, such as temperature.

Figure 30:
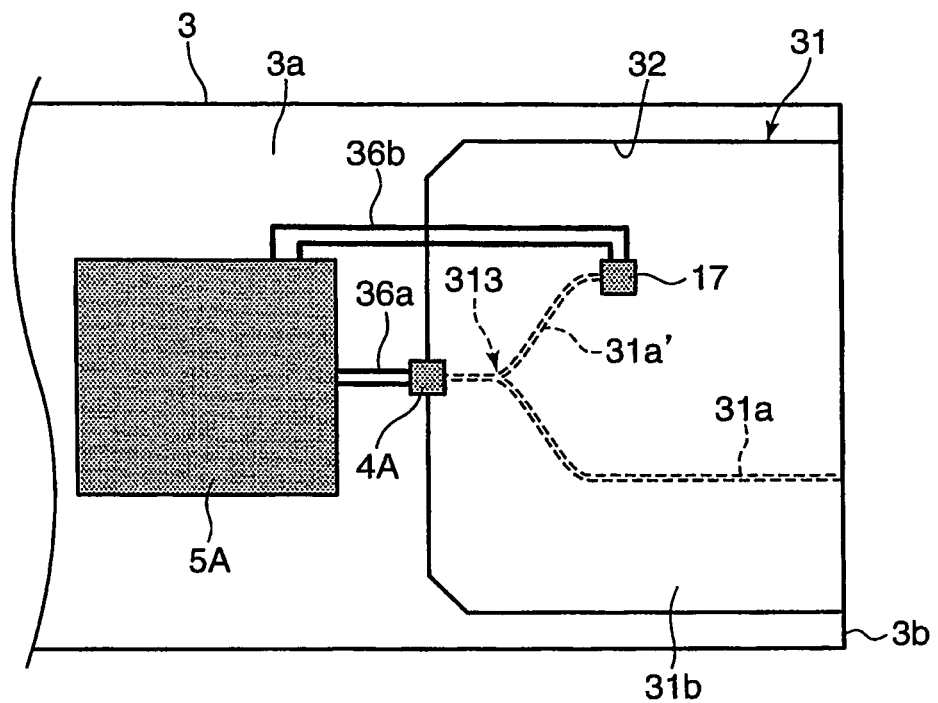
FIG. 30 is a bottom view of a mount substrate of a modified example.

Note that in order to enable the light receiving element 17 for monitoring to receive a part of the light emitted by the light emitting element 4A, for example as shown in FIG. 30, the branch 313 may be formed in the core 31a of the internal waveguide 31 to form a branch path 31a', so that the light receiving element 17 for monitoring is provided at a position corresponding to the leading edge of the branch path 31a'.

Figure 31A:
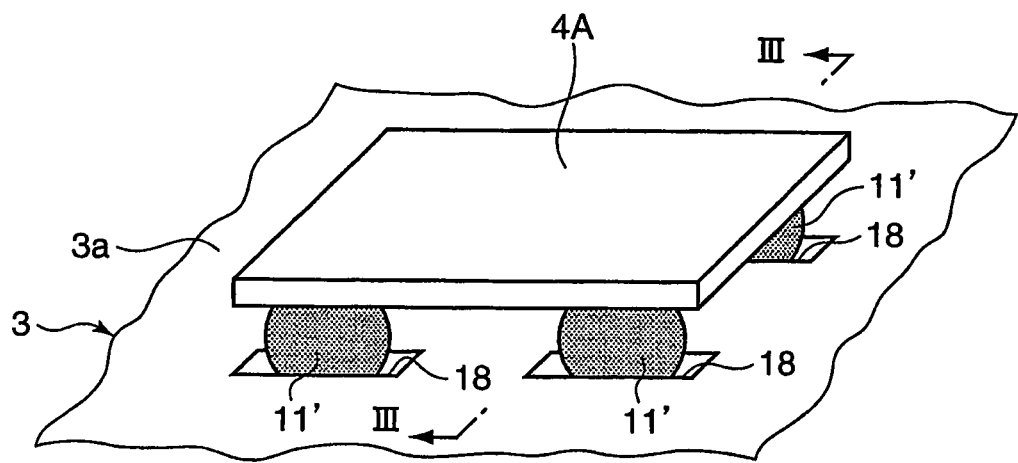
FIG. 31A is a perspective view of a mount substrate of a modified example.
Figure 31B:
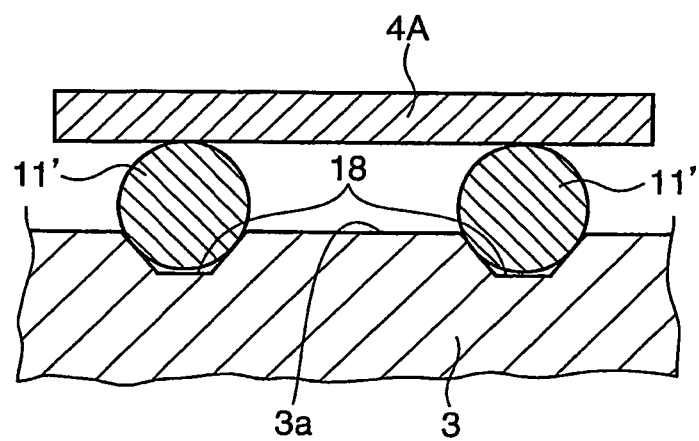
FIG. 31B is a sectional view along the line in FIG. 31A.

Fourth, as shown in FIG. 31A and FIG. 31B, when solder balls 11' are used for the mounting of the light emitting element 4A to the one surface 3a of the mount substrate 3, a recess 18 in which the solder ball 11' can be fit is provided at a position corresponding to the solder ball 11', on the one surface 3a of the mount substrate 3. The recess 18 is constituted by a groove formed on the one surface 3a of the mount substrate 3.

Thereby, the solder ball 11' can be positioned with high precision by the recess 18 provided on the one surface 3a of the mount substrate 3, which makes it possible to improve the positioning accuracy of the light emitting element 4A, and to reduce the optical coupling loss between the light emitting element 4A and the internal waveguide 31 caused by the mounting position deviation of the light emitting element 4A.

Figure 32A:
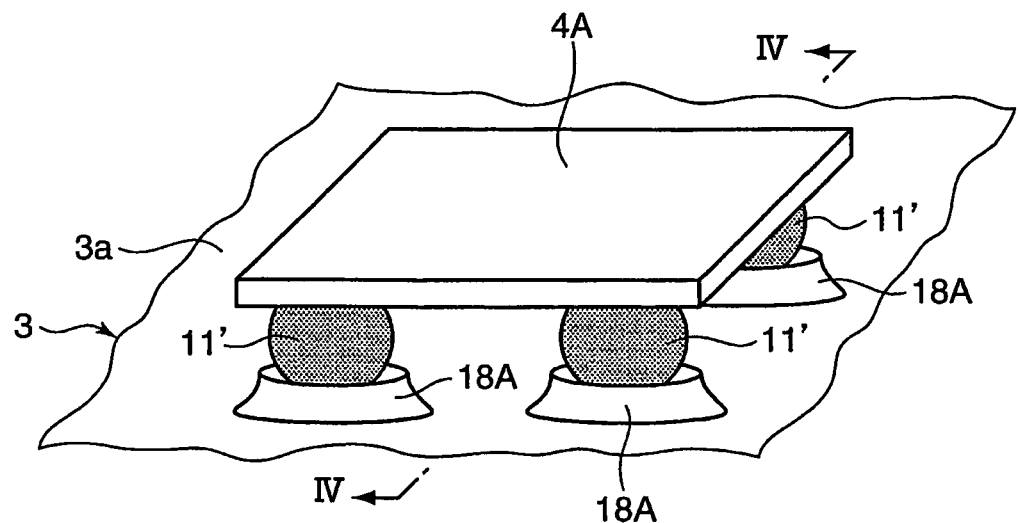
FIG. 32A is a perspective view of a mount substrate of a modified example.
Figure 32B:
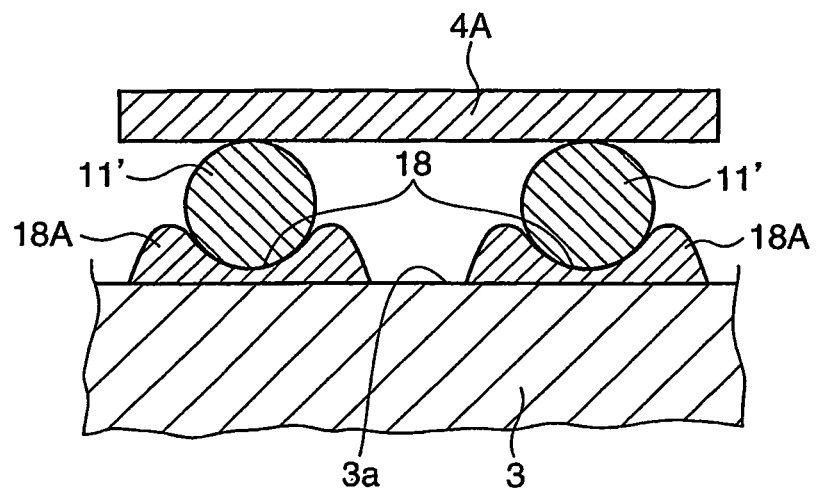
FIG. 32B is a sectional view along the line IV-IV, in FIG. 32A.

Note that the recess 18 can also be constituted by a solder paste 18A as shown in FIG. 32A and FIG. 32B. That is, the solder paste 18A having the recess 18 can be simply formed by applying the solder in the shape of a circle at the time of application.

Figure 33A:
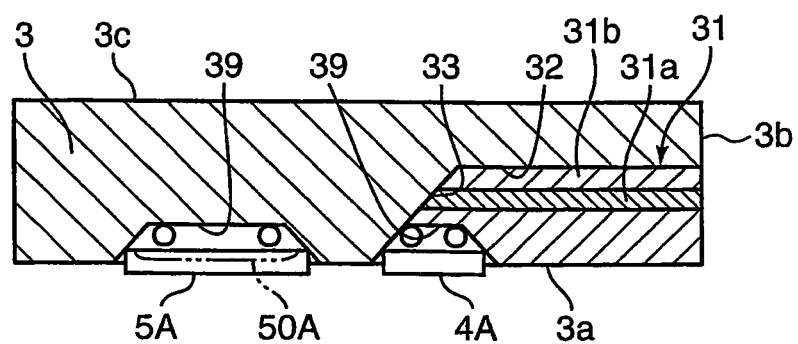
FIG. 33A is a side view of a mount substrate of a modified example.
Figure 33B:
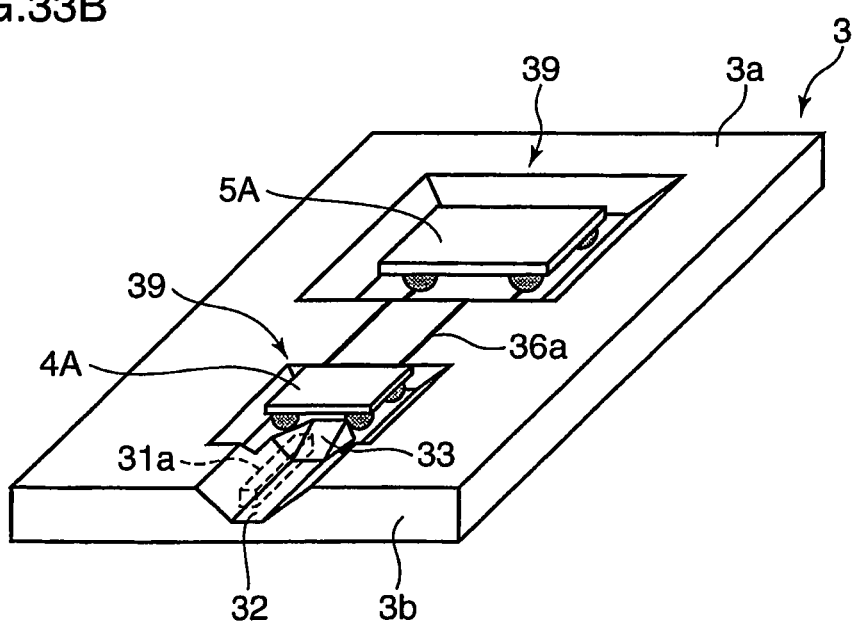
FIG. 33B is a perspective view of the mount substrate of the modified example.

Further, as shown in FIG. 33A and FIG. 33B, it is also possible to provide recessed portions 39 for dropping the light emitting element 4A and the IC substrate 5A, on the one surface 3a of the mount substrate 3.

Thereby, it is possible to reduce the height of the device in correspondence with the amount by which the light emitting element 4A and the IC substrate 5A are dropped. Specifically, in the case where the interposer substrate 8 is provided as in the third embodiment and the fifth embodiment, it is possible to reduce the size of the solder ball 15 in correspondence with the amount by which the light emitting element 4A and the IC substrate 5A are dropped, while in the case where the interposer substrate 8 is not provided as in the first embodiment and the second embodiment, it is possible to reduce the size of the solder ball 10 in correspondence with the amount by which the light emitting element 4A and the IC substrate 5A are dropped.

Figure 34A:
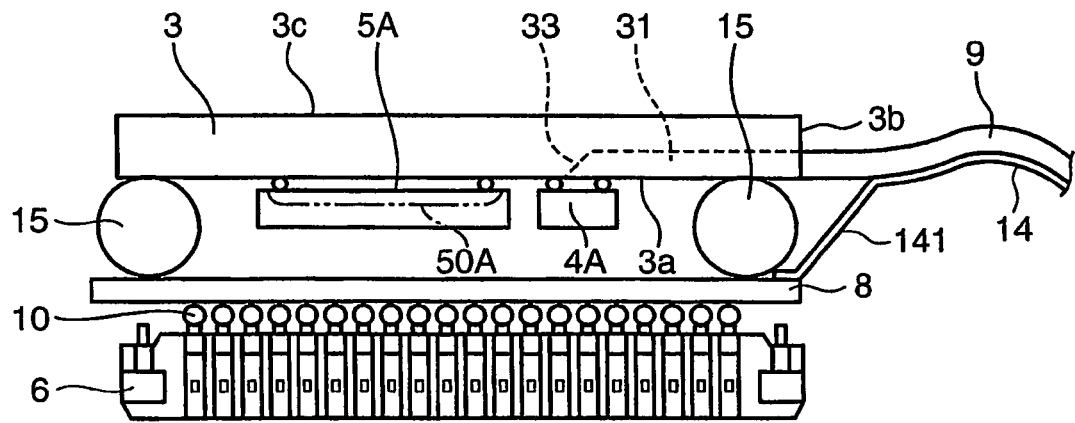
FIG. 34A and FIG. 34B are figures schematically showing a constitution of a photoelectric converter of a modified example.

Fifth, in the case where the interposer substrate 8 is provided as in the third embodiment and the fifth embodiment, and where the electric circuit film 14 having the conductive line 14a for transmitting/receiving power to/from the light receiving side photoelectric converting portion (not shown) is provided on the external waveguide as in the fourth embodiment, the end 141 of the electric circuit film 14 is joined to the upper surface of the interposer substrate 8 as shown in FIG. 34A, so that the conductive line 14a is directly connected to the interposer substrate 8.

Here, it is also possible to directly connect the conductive line 14a to the mount substrate 3. However, when the conductive line 14a is adapted to be directly connected to the interposer substrate 8 as shown in FIG. 34A, the wiring pattern 36 to be formed on the mount substrate 3 can be reduced more than the case where the conductive line 14a is directly connected to the mount substrate 3. This makes it possible to reduce the size of the mount substrate 3, and also to prevent the effect of the noise source such as the power source line constituted by the conductive line 14a from being transmitted to the mount substrate. Further, this makes it possible to form a number of electric signal lines.

Figure 34B:
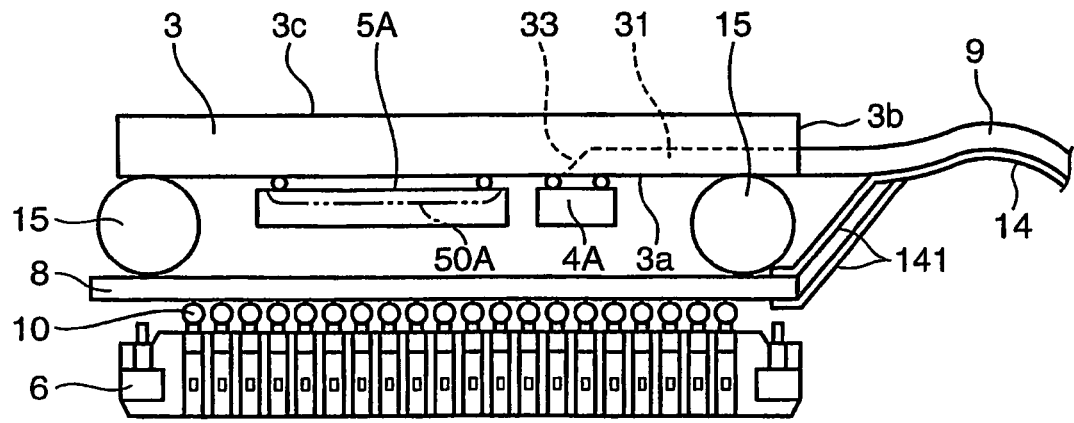

Alternatively, as shown in FIG. 34B, it is possible to connect the conductive line 14a to both the upper and lower surfaces of the interposer substrate 8 in such a manner that the end 141 of the electric circuit film 14 is divided into two, and one end 141 is joined to the upper surface of the interposer substrate 8, and the other end 141 is joined to the lower surface of the interposer substrate 8.

Thereby, it is possible to further increase the effect of the constitution shown in FIG. 34A, and to improve the connection strength between the electric circuit film 14 and the interposer substrate 8.

That is, the present invention according to the above described embodiments provides a photoelectric converter characterized by including: a mount substrate; an IC circuit provided on the mount substrate; an optical element adapted to have a function of converting an electric signal output from the IC circuit into an optical signal and emitting light or a function of converting a received optical signal to an electric signal and outputting the electric signal to the IC circuit; and a waveguide adapted to effect an optical coupling between the optical element and an external optical device, and in that the optical element is held by the mount substrate and has a light emitting surface or a light receiving surface, the light emitting surface or the light receiving surface of the optical element being directed toward the surface of the mount substrate, and in that the waveguide is provided in the mount substrate along the surface of the mount substrate.

According to the present invention, the waveguide is provided along the surface of a mount substrate, which makes it possible to suppress the height of the whole device in the thickness direction of the mount substrate, and to achieve the low height of the device.

Preferably, the photoelectric converter further includes an electric connector which is provided on either one surface or the other surface of the mount substrate, and is capable of electrically connecting the IC circuit to an external connector.

Here, the one surface and the other surface of the mount substrate mean both surfaces in the thickness direction of the mount substrate. Further, in the above described constitution, the electric connector is provided on the one surface of the mount substrate on which the optical element is mounted, or on the other surface opposite the one surface, to thereby make it possible to electrically connect the IC circuit to the external connector.

In the photoelectric converter, the waveguide preferably includes: a mirror portion adapted to convert the optical path of the optical signal by approximately 90 degrees; an internal waveguide adapted to be provided so as to extend from the mirror portion to the end surface of the mount substrate; and an external waveguide adapted to optically couple the internal waveguide to the external optical device, which is joined to the end surface of the mount substrate.

For example, it is possible to constitute the waveguide by providing a through hole at a position corresponding to the optical element of the mount substrate, and providing an optical fiber, or the like, whose end is cut at an angle of 45 degrees, on the other surface of the mount substrate. However, as described above, when the waveguide is constituted by the mirror portion and the internal waveguide which are provided in the mount substrate and by the external waveguide joined to the end surface of the mount substrate, it is possible to reduce the height of the device more as compared with the constitution as described above.

In the photoelectric converter, the mount substrate is preferably a silicon substrate.

When the mount substrate is a silicon substrate in this way, the mirror portion and the internal waveguide can be easily formed.

In the photoelectric converter, it is preferred that an electric connector is provided with a recessed portion in which the mount substrate can be fit, and the bottom surface of the recessed portion is joined to the one surface or other surface of the mount substrate.

According to the above described constitution, the recessed portion in which the mount substrate can be fit, is provided in the electric connector, which makes it possible to further reduce the height of the device.

In the photoelectric converter, it is preferred that a wiring substrate for changing the electrode pattern is interposed between the mount substrate and the electric connector.

By using the wiring substrate for changing the electrode pattern in this way, it is possible to improve the flexibility of the wiring pattern of the mount substrate.

In the photoelectric converter, it is preferred that the wiring substrate is a freely bendable flexible substrate extending in the direction in which the waveguide extends, and that an electric circuit for transmitting/receiving power to/from the other photoelectric converter is formed in the wiring substrate.

According to this constitution, it is possible to perform electric wiring with the other photoelectric converter by utilizing the wiring substrate. Further, the wiring substrate is a flexible substrate, which makes it possible to bend the wiring substrate together with the waveguide.

In the photoelectric converter, it is preferred that a conductive line for transmitting/receiving power to/from the other photoelectric converter is provided for the waveguide, and the conductive line is directly connected to the electric connector.

By providing the conductive line for the waveguide in this way, electric wiring with the other photoelectric converter can be performed by utilizing the waveguide. Further, the conductive line is directly connected to the electric connector, which makes it possible to effect the electric connection for an electric signal and the electric connection for transmission or reception of power by the single electric connector.

In the photoelectric converter, it is preferred that a plurality of light emitting elements, which emit light beams of wavelengths different from each other, are mounted on the mount substrate as the optical element, and the waveguide has a plurality of incident portions optically coupled to the respective light emitting elements, and one emitting portion connected to the incident portions.

According to this constitution, the plurality of light beams having different wavelengths are adapted to be propagated by the waveguide in a superimposed state, so that it is possible to significantly increase the amount of data which can be sent by a single device.

In the photoelectric converter, it is preferred that a light emitting element is mounted as the optical element on the mount substrate, and the waveguide includes an incident portion optically coupled to the light emitting element and a plurality of emitting portions connected to the incident portion.

According to this constitution, the light beam emitted by the light emitting element is adapted to be distributed and propagated by the waveguide, which enables one-to-many data transmission.

In the photoelectric converter, it is preferred that heat dissipating means for dissipating heat generated by the optical element is provided on the mount substrate.

According to this constitution, the heat generated by the optical element is dissipated by the heat dissipating means, which makes it possible to suppress the effect of the heat generated by the optical element.

In the photoelectric converter, it is preferred that an IC substrate which has the IC circuit formed therein and is mounted on the mount substrate is further provided, the wiring substrate is interposed between the mount substrate and the electric connector, and a heat dissipating component having a relatively high thermal conductivity is arranged between the wiring substrate and the mount substrate, so as to be in contact both with the wiring substrate and with at least one of the optical element and the IC substrate which are mounted on the mount substrate.

According to this constitution, the heat generated by the optical element or the IC substrate is adapted to be conducted to the wiring substrate via the heat dissipating component and dissipated, which makes it possible to dissipate the heat generated by the optical element or the IC substrate by rationally utilizing the wiring substrate.

In the photoelectric converter, it is preferred that a light emitting element as the optical element and a light receiving element for monitoring which outputs an output of the light emitting element as a monitor signal by receiving a part of the light emitted by the light emitting element are mounted on the mount substrate, and that the IC circuit includes a control circuit adapted to adjust an electric signal transmitted to the light emitting element so as to make the output of the light emitting element constant, on the basis of the monitor signal output from the light receiving element for monitoring.

According to this constitution, the output of the light emitting element can be made constant without being influenced by the environment, such as temperature.

In the photoelectric converter, it is preferred that the optical element is mounted on the mount substrate by means of solder balls, and a recess in which the solder ball can be fit is provided on the mount substrate at a position where the solder ball is arranged.

According to this constitution, the solder ball can be positioned with high precision by the recess provided on the one surface of the mount substrate, which makes it possible to improve the positioning accuracy of the optical element and to reduce the optical coupling loss between the optical element and the waveguide caused by the mounting position deviation of the optical element.

In the photoelectric converter, it is preferred that a recessed portion in which the optical element is dropped is provided in the mount substrate.

According to this constitution, it is possible to reduce the height of the device in correspondence with the amount by which the optical element is dropped.

In the photoelectric converter, it is preferred that a conductive line for transmitting/receiving power to/from the other photoelectric converter is provided and directly connected to the wiring substrate.

That is, in the case where the conductive line for transmitting/receiving power to/from the other photoelectric converter is provided in the waveguide, it is also possible to directly connect the conductive line to the mount substrate. However, as in the above described constitution, when the conductive line is adapted to be directly connected to the wiring substrate, it is possible to reduce the wiring pattern to be formed on the mount substrate more than the case where the conductive line is directly connected to the mount substrate.

INDUSTRIAL APPLICABILITY

According to the present invention, it is possible to achieve the low height of the photoelectric converter.

The invention claimed is:

1. A photoelectric converter, comprising:
   a mount substrate;
   an IC circuit;
   an optical element adapted to have a function of converting an electric signal output by the IC circuit to an optical signal and emitting light, or a function of converting a received optical signal to an electric signal and outputting the electric signal to the IC circuit; and
   a waveguide adapted to effect an optical coupling between the optical element and an external optical device,
   wherein the optical element is held by the mount substrate and has a light emitting surface or a light receiving surface, the light emitting surface or the light receiving surface of the optical element being directed to the mount substrate, and
   wherein the waveguide is provided in the mount substrate along the surface of the mount substrate.

2. The photoelectric converter according to claim 1, further comprising an electric connector adapted to be provided on one surface or the other surface of the mount substrate and to be capable of electrically connecting the IC circuit to an external connector.

3. The photoelectric converter according to claim 1, wherein the waveguide comprises a mirror portion adapted to convert the optical path of the optical signal by approximately 90 degrees; an internal waveguide adapted to be provided to extend from the mirror portion to an end surface of the mount substrate; and an external waveguide adapted to be joined to the end surface of the mount substrate and to effect an optical coupling between the internal waveguide and the external optical device.

4. The photoelectric converter according to claim 3, wherein the mount substrate is a silicon substrate.

5. The photoelectric converter according to claim 2, wherein a recessed portion in which the mount substrate can be fit is provided in the electric connector, and the bottom surface of the recessed portion is joined to the one surface or the other surface of the mount substrate.

6. The photoelectric converter according to claim 2, wherein a wiring substrate adapted to change an electrode pattern is interposed between the mount substrate and the electric connector.

7. The photoelectric converter according to claim 6, wherein the wiring substrate is a freely bendable flexible substrate extending in the direction in which the waveguide extends, and an electric circuit for transmitting/receiving power to/from the other photoelectric converter is formed in the wiring substrate.

8. The photoelectric converter according to claim 1, wherein a conductive line for transmitting/receiving power to/from the other photoelectric converter is provided for the waveguide, and the conductive line is directly connected to the electric connector.

9. The photoelectric converter according to claim 1, wherein a plurality of light emitting elements adapted to emit light beams having wavelengths different from each other are mounted as the optical element, and wherein the waveguide comprises a plurality of incident portions adapted optically coupled to the respective light emitting elements, and an emitting portion connected to the incident portions.

10. The photoelectric converter according to claim 1, wherein an light emitting element is mounted as the optical element on the mount substrate, and wherein the waveguide comprises an incident portion optically coupled to the light emitting element and a plurality of emitting portions connected to the incident portion.

11. The photoelectric converter according to claim 1, wherein heat dissipating means adapted to dissipate heat generated by the optical element is provided on the mount substrate.

12. The photoelectric converter according to claim 6, further comprising an IC substrate that has the IC circuit formed therein and is mounted on the mount substrate,
wherein the wiring substrate is interposed between the mount substrate and the electric connector, and wherein a heat dissipating component having a relatively high thermal conductivity is arranged between the wiring substrate and the mount substrate, to be in contact both with the wiring substrate and with at least one of the optical element and the IC substrate which are mounted on the mount substrate.

13. The photoelectric converter according to claim 1, wherein an light emitting element as the optical element and a light receiving element for monitoring adapted to output an output of the light emitting element as a monitor signal by receiving a part of light emitted by the light emitting element, are mounted on the mount substrate, and wherein the IC circuit includes a control circuit adapted to adjust an electric signal to be transmitted to the light emitting element to make the output of the light emitting element constant, on the basis of the monitor signal output from the light receiving element for monitoring.

14. The photoelectric converter according to claim 1, wherein the optical element is mounted on the mount substrate by a solder ball, and a recess in which the solder ball is fit is provided at a position on the mount substrate where the solder ball is arranged.

15. The photoelectric converter according to claim 1, wherein a recessed portion into which the optical element is to be dropped is provided in the mount substrate.

16. The photoelectric converter according to claim 6, wherein a conductive line for transmitting/receiving power to/from the other photoelectric converter is provided in the waveguide, and is directly connected to the wiring substrate.

* * * * *